United States Patent
Al-Kaysi

(10) Patent No.: US 11,193,058 B2
(45) Date of Patent: Dec. 7, 2021

(54) METHOD FOR CONTROLLING CHARGE-TRANSFER CO-CRYSTALS GROWTH

(71) Applicants: National Guard Health Affairs, Riyadh (SA); King Saud bin Abdulaziz University for Health Sciences, Riyadh (SA); King Abdullah International Medical Research Center, Riyadh (SA)

(72) Inventor: Rabih Omran Al-Kaysi, Riyadh (SA)

(73) Assignees: National Guard Health Affairs, Riyadh (SA); King Saud bin Abdulaziz University for Health Sciences, Riyadh (SA); King Abdullah International Medical Research Center, Riyadh (SA)

( * ) Notice: Subject to any disclaimer, the term of this patent is extended or adjusted under 35 U.S.C. 154(b) by 161 days.

(21) Appl. No.: 16/521,208

(22) Filed: Jul. 24, 2019

(65) Prior Publication Data
US 2021/0024822 A1 Jan. 28, 2021

(51) Int. Cl.
*C30B 7/14* (2006.01)
*C09K 11/06* (2006.01)
*C30B 29/54* (2006.01)

(52) U.S. Cl.
CPC ............. *C09K 11/06* (2013.01); *C30B 7/14* (2013.01); *C30B 29/54* (2013.01); *C09K 2211/1007* (2013.01); *C09K 2211/1011* (2013.01)

(58) Field of Classification Search
CPC .. C09K 11/06; C30B 7/00; C30B 7/14; C30B 29/607; C30B 29/66
See application file for complete search history.

(56) References Cited

U.S. PATENT DOCUMENTS

| | | |
|---|---|---|
| 4,769,177 A | 9/1988 | Hocker et al. |
| 5,238,526 A | 8/1993 | Miyanaga et al. |

FOREIGN PATENT DOCUMENTS

| | | |
|---|---|---|
| JP | 2014-7053 A | 1/2014 |
| JP | 6134292 B2 | 5/2017 |

OTHER PUBLICATIONS 1D versus 2D cocrystals growth via microspacing in-air sublimation, Ye et al., Nature Communications | (2019) 10:761.*
Vapor-phase π-π molecular recognition: a fast and solvent-free strategy towards the formation of co-crystalline hollow microtube with 1D optical waveguide and up-conversion emission, Fang et al., J. Mater. Chem. C, 2017, 5, 1632-1637.*
Molecular Crystal Microcapsules: Formation of Sealed Hollow Chambers via Surfactant-Mediated Growth, Tong et al., Angew. Chem. 2020, 132, 23235-23239.*
Rabih Al-Kaysi, "Co-Precipitation Method for the Fabrication of Charge-Transfer Molecular Crystal Nanocapsules", World Academy of Science, Engineering and Technology, International Journal of Chemical and Molecular Engineering, International Scholarly and Scientific Research & Innovation, vol. 11, No. 7, 2017, 1 page.
Rabia Usman, et al., "Investigation of Charge-Transfer Interaction in Mixed Stack Donor-Acceptor Cocrystals Toward Tunable Solid-State Emission Characteristics", Crystal Growth & Design, vol. 18, No. 10, 2018, pp. 6001-6008 (Abstract only).
Nicola Castagnetti, et al., "Extensive study of the electron donor 1,1,4,4-tetrathiabutadiene (TTB) and of its charge transfer crystal with TCNQ", Synthetic Metals, vol. 235, Jan. 2018, pp. 29-33 (Abstract only).
Sagar Jasud, et al., "Cocrystal: A Novel Approach for Bioavailability Enhancement", World Journal of Pharmacy and Pharmaceutical Sciences, vol. 2, Issue 6, 2013, pp. 4682-4697.
Rabih O. Al-Kaysi, et al., "Formation of Cocrystal Nanorods by Solid-State Reaction of Tetracyanobenzene in 9-Methylanthracene Molecular Crystal Nanorods", Crystal Growth & Design, vol. 9, No. 4, 2009, pp. 1780-1785.

* cited by examiner

*Primary Examiner* — Haidung D Nguyen
(74) *Attorney, Agent, or Firm* — Oblon, McClelland, Maier & Neustadt, L.L.P.

(57) ABSTRACT

Methods of preparing hollow charge transfer co-crystals with reproducible habits and morphology are disclosed. The disclosed methods utilize surfactant to guide the crystal growth in aqueous solutions. The size and shape of the co-crystal can be controlled by the surfactant used, the concentration of the surfactant, and electron donor and electron acceptor, incubation temperature, and mixing condition.

13 Claims, 45 Drawing Sheets

Examples of Electron Donor

Examples of Electron Acceptor

A

B

F

C

D

G

E

METHOD FOR CONTROLLING CHARGE-TRANSFER CO-CRYSTALS GROWTH

BACKGROUND OF THE INVENTION

Field of the Invention

The invention is related to charge-transfer co-crystals and methods of making charge-transfer co-crystals and methods of controlling crystal habit, shape, size and size distribution.

Description of Related Art

The "background" description provided herein is for the purpose of generally presenting the context of the disclosure. All references cited herein are incorporated by reference. Work of the presently named inventors, to the extent it is described in this background section, as well as aspects of the description which may not otherwise qualify as prior art at the time of filing, are neither expressly or impliedly admitted as prior art against the present disclosure.

Controlling the shape and size of molecular crystals can be useful for modifying their photophysical behavior, pharmacokinetics, mechanical and photomechanical properties [Piland et al. "How Morphology Affects Singlet Fission in Crystalline Tetracene" J. Phys. Chem. Lett. 2015, 6, 1841-1846, doi:10.1021/acs.jpclett.5b00569; Chen et al. "Pharmaceutical crystallization" Cryst. Growth Des. 2011, 11, 887-895, doi:10.1021/cg101556s; Panda et al. "Spatially resolved analysis of short-range structure perturbations in a plastically bent molecular crystal" Nat. Chem. 2015, 7, 65-72, doi:10.1038/nchem.2123; Reddy et al. "Structure-property correlations in bending and brittle organic crystals" Cryst. Growth Des. 2006, 6, 2720-2731, doi:10.1021/cg060398w; Naumov et al. "Mechanically Responsive Molecular" Crystals. Chem. Rev. 2015, 115, 12440-12490, doi:10.1021/acs.chemrev.5b00398; Kim et al. "Organic photomechanical materials. Chemphyschem 2014, 15, 400-14, doi:10.1002/cphc.201300906; Al-Kaysi et al. "Photoinduced Shape Changes of Crystalline Organic Nanorods" Adv. Mater. 2007, 19, 1276-1280, doi:10.1002/adma.200602741; Zhu et al. "Reversible photoinduced twisting of molecular crystal microribbons" J. Am. Chem. Soc. 2011, 133, doi:10.1021/ja201925p; Zhu et al. "Photoinduced Ratchet-Like Rotational Motion of Branched Molecular Crystals" Angew. Chemie Int. Ed. 2016, 55, 7073-7076, doi:10.1002/anie.201511444; Zhu et al. "Characterization of a P-type photomechanical molecular crystal based on the E [rightward arrow] Z photoisomerization of 9-divinylanthracene malonitrile. J. Mater. Chem. C 2016, 4, 8245-8252, doi:10.1039/C6TC02517J; Kim et al. "Photoinduced curling of organic molecular crystal nanowires" Angew. Chemie. Int. Ed. 2013, 52, doi:10.1002/anie.201302323; and Al-Kaysi et al. "Highly branched photomechanical crystals" Chem. Commun. 2017, 53, 2622-2625, doi:10.1039/C6CC08999B]. Unlike inorganic and metallic crystals that are bound by strong ionic or metallic bonds, respectively, the weak van der Waals forces between organic molecules in a crystal renders them soft, brittle, and difficult to grow in an exact and reproducible shape. Sublimation or crystallization from appropriate solvents produces random shaped crystals with no preferred size, and a heterogeneous size distribution.

Several strategies have been implemented to grow uniformly shaped crystals with regular morphology, including solvent annealing inside anodic aluminum oxide (AAO) templates and co-precipitation from aqueous surfactants. Solvent annealing inside AAO templates is limited only to cylindrical nanowires [Al-Kaysi et al. "General method for the synthesis of crystalline organic nanorods using porous alumina templates" Chem. Commun. 2006, 1224, doi:10.1039/b516732a; Al-Kaysi et al. "Fabrication of one-dimensional organic nanostructures using anodic aluminum oxide templates" J. Nanomater. 2009, 2009, doi:10.1155/2009/436375; Zhang et al. "Polyhedral Organic Microcrystals: From Cubes to Rhombic Dodecahedra" Angew. Chemie Int. Ed. 2009, 48, 9121-9123, doi:10.1002/anie.200902929; Yang et al. "A polyhedral supramolecular system of endocyclic crystalline organic nanostructurs: the case of triptycenes" CrystEngComm 2015, 17, 1448-1452, doi:10.1039/C4CE02379J; Zha et al. "Facile formation of microscale hollow superstructures made of organic nanocrystals and their application as a humidity sensor" CrystEngComm 2012, 14, 819-823, doi:10.1039/C1CE06139A; Zhang et al. "Crystal Structure Origin for Shape-Dependent Emission of 2,5,8,11-Tetra-tert-butylperylene Micro-/Nanocrystals" Cryst. Growth Des. 2011, 11, 3677-3680, doi:10.1021/cg200159w; Joshi, S. "Crystal Habit Modification Using Habit Modifiers" Mod. Asp. Bulk Cryst. Thin Film Prep. 2012, 413-436, doi:10.1016/0022-0248(75)90066-4; Zhang et al. "Morphology-controllable synthesis of pyrene nanostructures and its morphology dependence of optical properties" J. Phys. Chem. B 2005, 109, 18777-18780, doi:10.1021/jp052385j; Fu et al. "Nanofibers of 1,3-diphenyl-2-pyrazoline induced by cetyltrimethylammonium bromide micelles" Angew. Chemie. Int. Ed. 2003, 42, 2883-2886, doi:10.1002/anie.200350961; Wang et al. "Polymer-assisted fabrication of crystalline rectangular microtubes of triphenylimidazole derivatives" CrystEngComm 2012, 14, 5517, doi:10.1039/c2ce25068c; Lai et al. "Synthesis of Ultrathin Nanosheets of Perylene" Cryst. Growth Des. 2015, 15, 1011-1016, doi:10.1021/cg5015016; Lei et al. "Phase- and Shape-Controlled Synthesis of Single Crystalline Perylene Nanosheets and Its Optical Properties" J. Phys. Chem. C 2009, 113, 10038-10043, doi:10.1021/jp901357t; Peng et al. "Surfactant-assisted self-assembled polymorphs of AIEgen di(4-propoxyphenyl)dibenzofulvene" J. Mater. Chem. C 2017, doi:10.1039/C6TC04616A; Gu et al. "Controllable Self-Assembly of Di(p-methoxylphenyl)Dibenzofulvene into Three Different Emission Forms" Small 2012, 8, 3406-3411, doi:10.1002/smll.201201334; Lin et al. "Kinetically Controlled Assembly of a Spirocyclic Aromatic Hydrocarbon into Polyhedral Micro/Nanocrystals" ACS Nano 2012, 6, 5309-5319, doi:10.1021/nn3011398; and Das et al. "Morphology directing synthesis of benzo[a]pyrene microstructures and their photo physical properties" J. Mol. Liq. 2015, 206, 47-55, doi:10.1016j.molliq.2015.01.044]. On the other hand, surfactant mediated co-precipitation generates faceted and uniformly sized crystals with a crystalline habit that depends on the nature of the surfactant. In most cases, solid core crystals are formed. In some rare cases, tubular or hollow crystals can be grown under certain conditions [Zhao et al. (2012); Wang et al. (2012); Pérez-Hernindez et al. "Water-induced molecular self-assembly of hollow tubular crystals" Cryst. Growth Des. 2011, 11, 1054-1061, doi:10.1021/cg101227u; Bhargavi et al. "Generation of Hollow Crystals of a Drug with Lamellar Structure Forming Ability" Cryst. Growth Des. 2017, 17, 1480-1483, doi:10.1021/acs.cgd.7b00099; Eddieston et al. "Formation of tubular crystals of pharmaceutical compounds" Cryst. Growth Des. 2010, 10, 365-370, doi:10.1021/cg900969n; and Zhang et al. Single-crystal nanoribbons, nanotubes, and nanowires from intramolecular charge-transfer organic molecules" J. Am. Chem. Soc. 2007, 129, 3527-32, doi:10.1021/ja0642109]. However, the tubular crystal size and dimensions of the hollow cavity are uncontrollable. Surfactant mediated co-precipitations have been carried out only on single component crystals leading to the formation of two dimensional ultrathin crystals, polyhedral microcrystals, sheaf-like crystals, and microwires crystals [Lai et al. (2015); Zhang et al. (2009); Yang et al. (2015); Al-Kaysi et al. "Highly branched photomechanical crystals" Chem. Commun. 2017, 53, doi:10.1039/C6CC08999B; and Al-Kaysi et al. "Chemical reaction method for growing photomechanical organic microcrystals" CrystEngComm 2015, 17, 8835-8842, doi:10.1039/C4CE02387K].

JP6134292B2 discloses a reactive silyl group-containing charge transfer complex which is utilized for manufacturing a transparent oxide electrode for organic semiconductors and organic electrodes.

U.S. Pat. No. 4,769,177 discloses electrically conductive or antistatic polymers containing charge transfer complexes comprising one electron donor and one or more electron acceptors. The electron donor is disclosed to be an organic compound containing nitrogen, and/or oxygen, and/or sulfur such as trimethylamine, diethylcycloexylamine, quinoline, benzo-2,3-quinoline, benzothiazole, and O-phenanthroline. U.S. Pat. No. 4,769,177 further discloses that polycyano or polynitro organic compounds such as tetracyanoethylene, tetracyanoquinodimethane, and trinitrofluorene are good electron acceptors.

U.S. Pat. No. 5,238,526 discloses the formation of a charge transfer complex of a donor and acceptor formed through a vapor phase reaction. The acceptor molecules are tetracyanoquinodimethane and derivatives thereof and tetracyanonaphthoquinodmethane and derivatives thereof. The donor molecules disclosed are tetramethyltetrathiafulvalene and tetramethyltetraselenafluvalene.

Usmman et al. [Cryst. Growth Des. (2018) 18(18) 6001-6008] discloses three mixed binary charge transfer co-crystals of (naphthalene-2-yl)-2-(p-tolyl) acrylonitrile (NPA), 3-(anthracene-9-yl)-2-phenylacrylonitrile (APA), and 2-(4-methoxyphenyl)-3-(pyrene-1-yl) acrylonitrile (MPA) as donors (D) with 1,2,4,5-tetracyanobenzene (TCNB) as an acceptor (A). Usmman does not disclose the use of detergents to control the shapes and habits of the crystals formed.

Castagnetti e al. [Synth. Metals (2018) 235, 29-33] discloses a charge transfer co-crystal of 1,1,4,4-tetrathiabutadiene and tetracyanoquinodimethae (TCNQ) and its spectroscopic properties. Castagnetti does not disclose a method of controlling the shapes and habits of the crystals formed.

Jasude et al. [World J. Pharm. Pharmaceut. Sci. 2 (6) 4682-4697] is a review article regarding co-crystals and their use in pharmaceuticals. Jasude discloses the formation of a charge transfer nanocrystal of 9-methylanthracene and tetracyanobenzene. The co-crystal is formed by exposing a crystalline nano-rod of 9-methyanthracene to a suspension of tetracyanobenzene in water. The crystal is obtained in the absence of detergent from a heterogeneous solution.

Al-Kaysi, R. [Int. J. Chem. Mol. Engin. Vol. 11 (7) 2017] is a preliminary report on the formation of a charge transfer hollow rectangular co-crystal comprising the π-electron donor 9-methylanthracene and π-electron acceptor tetracyanobezene, and is made by precipitation from an aqueous solution containing sodium dodecyl sulfate.

It is one object of the present disclosure to provide a method for making charge transfer hollow crystals in uniform shapes and habits by co-precipitation of electron donor and acceptor molecules from surfactant-containing solutions.

SUMMARY OF THE INVENTION

A first aspect of the invention is directed to a hollow hexagonal rod shaped charge-transfer co-crystal comprising a π-electron donor and π-electron acceptor and having one or more totally sealed compartments or voids.

In a preferred embodiment, the electron π-donor is an optionally substituted naphthalene, anthracene, phenanthrene, pyrene, or chrysene.

In a more preferred embodiment, the optionally substituted anthracene is selected from the group consisting of anthracene, 9-methylanthracene (9-MA) (FIG. 1A), 9-methoxyanthracene (MXA), tert-butyl anthracene-9-carboxylate (9TBAE), or 9,10-dimethylanthracene.

In another preferred embodiment, the π-electron acceptor is 1,2,4,5-tetracyanobenzene (TCNB)(FIG. 1A) or 2,3,5,6-tetrafluoroterephthalonitrile (TFPN).

In another preferred embodiment, the π-electron donor is 9-MA and the π-electron acceptor is TCNB.

A second aspect of the invention is directed to a method of preparing a hollow charge transfer co-crystal having one or more sealed compartments comprises:

mixing saturated solutions of π-electron donor and π-electron acceptor in aqueous non-ionic surfactant to form a mixture at a temperature in the range of 20-50° C., and incubating the mixture at the temperature for a time.

In a preferred embodiment, the non-ionic surfactant is a poloxymer.

In a more preferred embodiment, the poloxymer is poloxymer 407 (Pluronic F127™).

In another preferred embodiment, the electron π-donor is an optionally substituted naphthalene, anthracene, phenanthrene, pyrene, or chrysene.

In another preferred embodiment, the optionally substituted anthracene is selected from the group consisting of anthracene, 9-methylanthracene (9-MA), 9-methoxyanthracene (MXA), tert-butyl anthracene-9-carboxylate (9TBAE), and 9,10-dimethylanthracene.

In another preferred embodiment, π-electron acceptor is 1,2,4,5-tetracyanobenzene (TCNB) or 2,3,5,6-tetrafluoroterephthalonitrile (TFPN).

In another preferred embodiment, the hollow crystal is hexagonal rod-shaped crystal.

In another preferred embodiment, wherein the concentration of non-ionic surfactant is in the range of 0.001 wt % to 0.50 wt %.

In another preferred embodiment when using SDS as a surfactant the optimum concentration range was from 0.1 molar to 0.01 molar.

In another preferred embodiment when using a non-ionic surfactant the concentration range was close to that number 0.1 molar to 0.01 molar.

In another preferred embodiment, the charge transfer crystal is a rod-shaped hexagonal A third aspect of the invention is directed to a charge transfer hollow co-crystal comprising a π-electron donor and π-electron acceptor and having two or more sealed compartments with the proviso that the π-electron donor and π-electron acceptor are not 9-methylanthracene (9-MA) and 1,2,45-tetracyanobenzene, respectively (TCNB).

In a preferred embodiment, the co-crystal is rectangular or flat hexagonal with two symmetrical twin pockets.

In another preferred embodiment, the electron π-donor is an optionally substituted naphthalene, anthracene, phenanthrene, pyrene, or chrysene In a more preferred embodiment, the optionally substituted anthracene is selected from the group consisting of anthracene, 9-methylanthracene (9-MA), 9-methoxyanthracene (MXA), tert-butyl anthracene-9-carboxylate (9TBAE), or 9,10-dimethylanthracene.

In another preferred embodiment, the π-electron acceptor is 1,2,4,5-tetracyanobenzene (TCNB) or 2,3,5,6-tetrafluoroterephthalonitrile (TFPN).

In another preferred embodiment, the π-electron donor is naphthalene and the π-electron acceptor is TCNB.

A fourth aspect of the invention is directed to a method of preparing a charge-transfer hollow co-crystal comprising a π-electron donor and π-electron acceptor having two or more sealed compartment with the proviso that the π-electron donor and π-electron acceptor are not 9-methylanthracene (9-MA) and 1,2,45-tetracyanobenzene (TCNB), respectively comprises:

mixing saturated solutions of π-electron donor and π-electron acceptor in aqueous ionic surfactant to form a mixture at a temperature in the range of 20-50° C., and incubating the mixture at the temperature for a time.

In another preferred embodiment, the ionic detergent is sodium dodecyl sulfate (SDS) at a concentration in the range 0.005 to 0.50 M.

A fifth aspect of the invention is directed to a method of controlling dimensions of charge transfer crystal comprising an electron donor and an electron acceptor comprises:

preparing saturated solution A of an electron donor in an aqueous surfactant solution, preparing saturated solution B of an electron acceptor in an aqueous surfactant solution, pouring solution B on solution A to form a mixture, and transferring the mixture to another container a number of time in the range of 0 to 100, wherein the number of transfer determine the dimensions of the co-crystals.

The foregoing paragraphs have been provided by way of general introduction, and are not intended to limit the scope of the following claims. The described embodiments, together with further advantages, will be best understood by reference to the following detailed description taken in conjunction with the accompanying drawings

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION

Figure 1A:
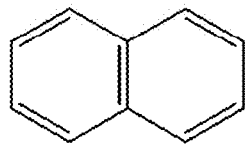
FIG. 1A shows examples of the chemical structures of π-electron donors such as naphthalene (A), anthracene (B), 9-methylanthracene (C) phenanthrene (D), and pyrene (E) and π-electron acceptors 1,2,4,5-Tetracyanobenzene. (F) and 2,3,5,6-tetrafluoroterephthalonitrile (G).
Figure 1A:
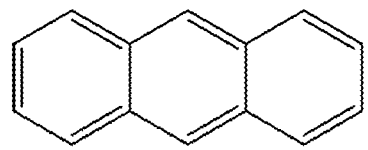
Figure 1A:
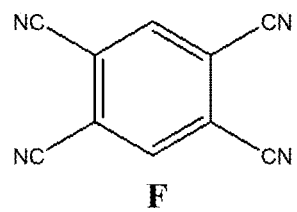
Figure 1A:
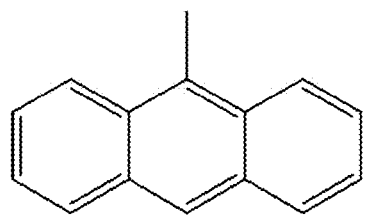
Figure 1A:
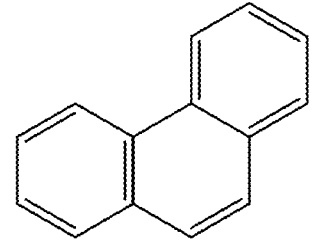
Figure 1A:
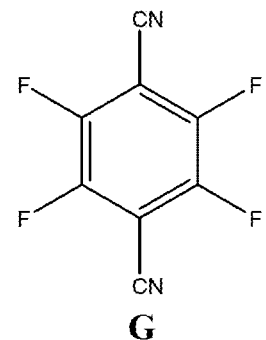
Figure 1A:
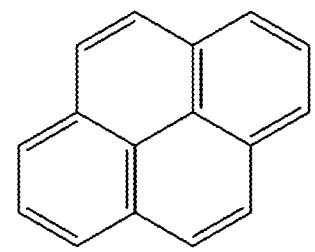

Embodiments of the present disclosure will now be described more fully hereinafter with reference to the accompanying drawings, in which some, but not all embodiments of the disclosure are shown. The present disclosure will be better understood with reference to the following definitions.

All publications mentioned herein are incorporated herein by reference in full for the purpose of describing and disclosing the methodologies, which are described in the publications, which might be used in connection with the description herein. Nothing herein is to be construed as an admission that the inventors are not entitled to antedate such disclosure by virtue of prior disclosure. Also, the use of "or" means "and/or" unless stated otherwise. Similarly, "comprise," "comprises," "comprising" "include," "includes," and "including" are interchangeable and not intended to be limiting.

Unless otherwise specified, "a" or "an" means "one or more".

As used herein, the term "about" refers to an approximate number within 20% of a stated value, preferably within 15% of a stated value, more preferably within 10% of a stated value, and most preferably within 5% of a stated value. For example, if a stated value is about 8.0, the value may vary in the range of 8±1.6, ±1.0, ±0.8, ±0.5, ±0.4, ±0.3, ±0.2, or ±0.1.

As used herein, the terms "compound" and "complex" are used interchangeably, and are intended to refer to a chemical entity, whether in a solid, liquid or gaseous phase, and whether in a crude mixture or purified and isolated.

As used herein, the term "solvate" refers to a physical association of a compound of this disclosure with one or more solvent molecules, whether organic or inorganic. This physical association includes hydrogen bonding. In certain instances, the solvate will be capable of isolation, for example when one or more solvent molecules are incorporated in the crystal lattice of the crystalline solid. The solvent molecules in the solvate may be present in a regular arrangement and/or a non-ordered arrangement. The solvate may comprise either a stoichiometric or nonstoichiometric amount of the solvent molecules. Solvate encompasses both solution phase and isolable solvates. Exemplary solvents include, but are not limited to, water, methanol, ethanol, n-propanol, isopropanol, n-butanol, isobutanol, tert-butanol, ethyl acetate and other lower alkanols, glycerine, acetone, dichloromethane (DCM), dimethyl sulfoxide (DMSO), dimethyl acetate (DMA), dimethyl formamide (DMF), isopropyl ether, acetonitrile, toluene, N-methylpyrrolidone (NMP), tetrahydrofuran (THF), tetrahydropyran, other cyclic mono-, di- and tri-ethers, polyalkylene glycols (e.g. polyethylene glycol (PEG), polypropylene glycol, propylene glycol), and mixtures thereof in suitable proportions. Exemplary solvates include, but are not limited to, hydrates, ethanolates, methanolates, isopropanolates and mixtures thereof. Methods of solvation are generally known to those skilled in the art.

As used herein, the term "tautomer" refers to constitutional isomers of organic compounds that readily convert by tautomerization or tautomerism. The interconversion commonly results in the formal migration of a hydrogen atom or proton, accompanied by a switch of a single bond and adjacent double bond. Tautomerism is a special case of structural isomerism, and because of the rapid interconversion, tautomers are generally considered to be the same chemical compound. In solutions in which tautomerization is possible, a chemical equilibrium of the tautomers will be reached. The exact ratio of the tautomers depends on several factors including, but not limited to, temperature, solvent and pH. Exemplary common tautomeric pairs include, but are not limited to, ketone and enol, enamine and imine, ketene and ynol, nitroso and oxime, amide and imidic acid, lactam and lactim (an amide and imidic tautomerism in heterocyclic rings), enamine and enamine and anomers of reducing sugars.

As used herein, the term "stereoisomer" refers to isomeric molecules that have the same molecular formula and sequence of bonded atoms (i.e. constitution), but differ in the three-dimensional orientations of their atoms in space. This contrasts with structural isomers, which share the same molecular formula, but the bond connection of their order differs. By definition, molecules that are stereoisomers of each other represent the same structural isomer. Enantiomers are two stereoisomers that are related to each other by reflection, they are non-superimposable mirror images. Every stereogenic center in one has the opposite configuration in the other. Two compounds that are enantiomers of each other have the same physical properties, except for the direction in which they rotate polarized light and how they interact with different optical isomers of other compounds. Diastereomers are stereoisomers not related through a reflection operation, they are not mirror images of each other. These include meso compounds, cis- and trans- (E- and Z-) isomers, and non-enantiomeric optical isomers. Diastereomers seldom have the same physical properties. In terms of the present disclosure, stereoisomers may refer to enantiomers, diastereomers, or both.

S Conformers, rotamers, or conformational isomerism refers to a form of isomerism that describes the phenomenon of molecules with the same structural formula but with different shapes due to rotations around one or more bonds. Different conformations can have different energies, can usually interconvert, and are very rarely isolatable. There are some molecules that can be isolated in several conformations. Atropisomers are stereoisomers resulting from hindered rotation about single bonds where the steric strain barrier to rotation is high enough to allow for the isolation of the conformers. In terms of the present disclosure, stereoisomers may refer to conformers, atropisomers, or both.

In terms of the present disclosure, stereoisomers of the double bonds, ring systems, stereogenic centers, and the like can all be present in the compounds, and all such stable isomers are contemplated in the present disclosure. Cis- and fat- (or E- and Z-) stereoisomers of the compounds of the present disclosure wherein rotation around the double bond is restricted, keeping the substituents fixed relative to each other, are described and may be isolated as a mixture of isomers or as separated isomeric forms. S- and R- (or L- and D-) stereoisomers of the compounds of the present disclosure are described and may be isolated as a mixture of isomers or as separated isomeric forms. All processes or methods used to prepare compounds of the present disclosure and intermediates made therein are considered to be part of the present disclosure. When stereoisomeric products are prepared, they may be separated by conventional methods, for example, by chromatography, fractional crystallization, or use of a chiral agent.

In addition, the present disclosure is intended to include all isotopes of atoms occurring in the present compounds and complexes. Isotopes include those atoms having the same atomic number but different mass numbers. By way of general example, and without limitation, isotopes of hydrogen include deuterium and tritium. Isotopes of carbon include $^{13}C$ and $^{14}C$. Isotopes of nitrogen include $^{14}N$ and $^{15}N$. Isotopes of oxygen include $^{16}O$, $^{17}O$, and $^{18}O$. Isotopically-labeled compounds of the disclosure may generally be prepared by conventional techniques known to those skilled in the art or by processes analogous to those described herein, using an appropriate isotopically-labeled reagent in place of the non-labeled reagent otherwise employed.

As used herein, the term "solvate" refers to a physical association of a compound of this disclosure with one or more solvent molecules, whether organic or inorganic. This physical association includes hydrogen bonding. In certain instances, the solvate will be capable of isolation, for example when one or more solvent molecules are incorporated in the crystal lattice of the crystalline solid. The solvent molecules in the solvate may be present in a regular arrangement and/or a non-ordered arrangement. The solvate may comprise either a stoichiometric or nonstoichiometric amount of the solvent molecules. Solvate encompasses both solution phase and isolable solvates. Exemplary solvents include, but are not limited to, water, methanol, ethanol, n-propanol, isopropanol, n-butanol, isobutanol, tert-butanol, ethyl acetate and other lower alkanols, glycerine, acetone, dichloromethane (DCM), dimethyl sulfoxide (DMSO), dimethyl acetate (DMA), dimethyl formamide (DMF), isopropyl ether, acetonitrile, toluene, N-methylpyrrolidone (NMP), tetrahydrofuran (THF), tetrahydropyran, other cyclic mono-, di- and tri-ethers, polyalkylene glycols (e.g. polyethylene glycol (PEG), polypropylene glycol, propylene glycol), and mixtures thereof in suitable proportions. Exemplary solvates include, but are not limited to, hydrates, ethanolates, methanolates, isopropanolates and mixtures thereof. Methods of solvation are generally known to those skilled in the art.

As used herein, the term "substituted" refers to at least one hydrogen atom that is replaced with a non-hydrogen group, provided that normal valences are maintained and that the substitution results in a stable compound. When a substituent is noted as "optionally substituted", the substituents are selected from the exemplary group including, but not limited to, halo, hydroxyl, alkoxy, oxo, alkanoyl, aryloxy, alkanoyloxy, amino, alkylamino, arylamino, arylalkylamino, disubstituted amines (e.g. in which the two amino substituents are selected from the exemplary group including, but not limited to, alkyl, aryl or arylalkyl), alkanylamino, aroylamino, aralkanoylamino, substituted alkanoylamino, substituted arylamino, substituted aralkanoylamino, thiol, alkylthio, arylthio, arylakylthio, alkylthiono, arylthiono, aryalkylthiono, alkylsulfonyl, arylsulfonyl, arylalkylsulfonyl, sulfonamide (e.g. —SO$_2$NH$_2$), substituted sulfonamide, nitro, cyano, carboxy, carbamyl (e.g. —CONH$_2$), substituted carbamyl (e.g. —CONHalkyl, —CONHaryl, —CONHarylalkyl or cases where there are two substituents on one nitrogen from alkyl, aryl, or alkylalkyl), alkoxycarbonyl, aryl, substituted aryl, guanidine, heterocyclyl (e.g. indolyl, imidazoyl, furyl, thienyl, thiazolyl, pyrrolidyl, pyridyl, pyrimidiyl, pyrrolidinyl, piperidinyl, morpholinyl, piperazinyl, homopiperazinyl and the like), substituted heterocyclyl and mixtures thereof and the like.

As used herein, the term "alkyl" unless otherwise specified refers to both branched and straight chain saturated aliphatic primary, secondary, and/or tertiary hydrocarbons of typically $C_1$ to $C_{10}$, preferably $C_1$ to $C_6$, more preferably $C_2$ to $C_3$, and specifically includes, but is not limited to, methyl, trifluoromethyl, ethyl, n-propyl, isopropyl, n-butyl, sec-butyl, isobutyl, t-butyl, pentyl, isopentyl, neopentyl, hexyl, isohexyl, 3-methylpentyl, 2,2-dimethylbutyl, and 2,3-dimethylbutyl.

As used herein, the term "cycloalkyl" refers to cyclized alkyl groups. Exemplary cycloalkyl groups include, but are not limited to, cyclopropyl, cyclobutyl, cyclopetyl, cyclohexyl, norbornyl, and adamantyl. Branched cycloalkyl groups such as exemplary 1-methylcyclopropyl and 2-methylcyclopropyl groups are included in the definition of cycloalkyl as used in the present disclosure.

The term "alkenyl" refers to a straight, branched, or cyclic hydrocarbon fragment containing at least one C=C double bond. Exemplary alkenyl groups include, without limitation, 1-propenyl, 2-propenyl (or "allyl"), 1-butenyl, 2-butenyl, 3-butenyl, 1-pentenyl, 2-pentenyl, 3-pentenyl, 4-pentenyl, 1-hexenyl, 2-hexenyl, 3-hexenyl, 4-hexenyl, 5-hexenyl, 1-heptenyl, 2-heptenyl, 3-heptenyl, 4-heptenyl, 5-heptenyl, 6-heptenyl, 1-octenyl, 2-octenyl, 3-octenyl, 4-octenyl, 5-octenyl, 6-octenyl, 7-octenyl, 1-nonenyl, 2-nonenyl, 3-nonenyl, 4-nonenyl, 5-nonenyl, 6-nonenyl, 7-nonenyl, 8-nonenyl, 1-decenyl, 2-decenyl, 3-decenyl, 4-decenyl, 5-decenyl, 6-decenyl, 7-decenyl, 8-decenyl, and 9-decenyl.

The term "alkynyl" refers to a straight or branched hydrocarbon fragment containing at least one C≡C triple bond. Exemplary alkynyl groups include, without limitation, ethynyl, 1-propynyl, 2-propynyl (i.e., propargyl), 1-butynyl, 2-butynyl, 3-butynyl, 1-pentynyl, 2-pentynyl, 3-pentynyl, 4-pentynyl, 1-hexynyl, 2-hexynyl, 3-hexynyl, 4-hexynyl, 5-hexynyl, 1-heptynyl, 2-heptynyl, 3-heptynyl, 4-heptynyl, 5-heptynyl, 6-heptynyl, 1-octynyl, 2-octynyl, 3-octynyl, 4-octynyl, 5-octynyl, 6-octynyl, 7-octynyl, 1-nonynyl, 2-nonynyl, 3-nonynyl, 4-nonynyl, 5-nonynyl, 6-nonynyl, 7-nonynyl, 8-nonynyl, 1-decynyl, 2-decynyl, 3-decynyl, 4-decynyl, 5-decynyl, 6-decynyl, 7-decynyl, 8-decynyl, and 9-decynyl.

The term "alkoxy" refers to a straight or branched chain alkoxy including, but not limited to, methoxy, ethoxy, propoxy, isopropoxy, butoxy, isobutoxy, secondary butoxy, tertiary butoxy, pentoxy, isopentoxy, hexyloxy, heptyloxy, octyloxy, nonyloxy, and decyloxy.

As used herein, the term "aryl" unless otherwise specified refers to functional groups or substituents derived from an aromatic ring including, but not limited to, phenyl, biphenyl, napthyl, anthracenyl, thienyl, and indolyl.

The term "arylalky", as used herein, refers to a straight or branched chain alkyl moiety having 1 to 8 carbon atoms that is substituted by an aryl group as defined herein, and includes, but is not limited to, benzyl, phenethyl, 2-methylbenzyl, 3-methylbenzyl, 4-methylbenzyl, 2,4-dimethylbenzyl, 2-(4-ethylphenyl)ethyl, 3-(3-propylphenyl)propyl, and the like.

The term "alkanoyl", as used herein, refers to an alkyl group of specified number of carbon atoms that is bound to an oxygen atom through a double bond. Exemplary alkanoyl groups include, but are not limited to, formyl, acetyl, propanoyl, butyryl, and hexanoyl.

The term "aroyl" as used in this disclosure refers to an aromatic carboxylic acyl group includes, for example, benzoyl, 1-naphthoyl, and 2-naphthoyl.

The term "halogen", as used herein, mea fluorine, chlorine, bromine, and iodine.

As used herein a "polymer" or "polymeric resin" refers to a large molecule or macromolecule, of many repeating subunits and/or substances composed of macromolecules. As used herein a "monomer" refers to a molecule or compound that may bind chemically to other molecules to form a polymer. As used herein the term "repeat unit" or "repeating unit" refers to a part of the polymer or resin whose repetition would produce the complete polymer chain (excluding the end groups) by linking the repeating units together successively along the chain. The process by which monomers combine end to end to form a polymer is referred to herein as "polymerization" or "polycondensation", monomers are molecules which can undergo polymerization, thereby contributing constitutional repeating units to the structures of a macromolecule or polymer. As used herein "resin" or "polymeric resin" refers to a solid or highly viscous substance or polymeric macromolecule containing polymers, preferably with reactive groups. As used herein a "copolymer" refers to a polymer derived from more than one species of monomer and are obtained by "copolymerization" of more than one species of monomer. Copolymers obtained by copolymerization of two monomer species may be termed bipolymers, those obtained from three monomers may be termed terpolymers and those obtained from four monomers may be termed quarterpolymers, etc. As used herein, "cross-linking", "cross-linked" or a "cross-link" refers to polymers and resins containing branches that connect polymer chains via bonds that link one polymer chain to another. The cross-link may be an atom, a group of atoms, or a number of branch points connected by bonds, groups of atoms, or polymer chains. In the majority of cases, a cross-link is a covalent structure or covalent bond but the term may also describe sites of weaker chemical interactions, portion crystallites, and even physical interactions and entanglements. The cross-linking can alter the physical and mechanical properties of the polymer. Cross-linking may be formed by chemical reactions that are initiated by heat, pressure, change in pH, and/or radiation, with or without the presence of a cross-linking agent and/or catalyst. In certain embodiments, at least one diaminoalkane or di-dithiocarbamate alkane functions as a cross-linking agent for the cross-linked polymeric resin described herein. In a preferred embodiment, the diaminoalkane or di-dithiocarbamate chains function as cross-linking agents or monomers can be add to the polymer or a polymerization reaction to modify to increase the cross-linking of the polymer.

As used herein, the terms "crystal" or "co-crystal" are used interchangeably and have the same meaning i.e., a charge transfer crystal comprising an electron donor and an electron acceptor.

A first aspect of the invention is directed to a hollow hexagonal rod-shaped charge-transfer (C) co-crystal comprising a π-electron donor and acceptor having one or more sealed compartments. The lattice of the crystal is composed of an electron deficient molecule, the π-electron acceptor (A), and an electron-rich molecule, the π-electron donor (D). When the donor and acceptor are complexed, an electron wave oscillates between them to form a ground state charge-transfer absorption band typically in the visible region of the spectrum. In the most basic model, the CT interaction can be viewed as a charge donation from the donor HOMO to the acceptor LUMO [Torrance et al. Phys. Rev. Lett. 1981, 46, 253-257—incorporated herein by reference in its entirety].

Any electron-rich molecule or ion may be used as π-electron donor. Polycyclic aromatic hydrocarbons (PAH) such as naphthalene, anthracene, pheanthrene, tetracene, penacene, pyrene, benz[a]anthracene, benzo[a]pyrene, chrysene, and the like are well-known π-electron donor. Derivatives of PAH that contain one or more electron donating substituents such as, but not limited to alkyl, amino, hydroxyl, or alkoxy groups are used as π-electron donors. Examples of useful π-electron donors of substituted PAHs include, but are not limited to 1,5-dihydroxynaphthalene, 1-amino-5-hydroxynaphthalene, 3,8-diaminopyrene, 4-hydroxypyrene, 9-methoxyphenanthrene, 9,10-dihydroxyanthracene, 7-methylbenzanthracene, 4-methylbenz[a]anthracene, 7,12-methylanthracene, and the like. Another class of π-electron donor are electron rich heterocyclic compounds such as, but not limited to indole, 6,7-benzindole, carbazole, N-phenylcarbazole, tetrathiafulvalene (structure shown below), and the like as well as derivatives thereof.

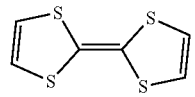

Tetrathiafulvalene

In some embodiment of the invention, the π-electron donor is selected from naphthalene, anthracene, phenanthrene, pyrene, or chrysene and derivatives thereof. Substituted anthracenes such as but not limited to 9-methylanthracene (9-MA), 9-methoxyanthracene (MXA), 9,10-dimethylanthracene, 9,10-dimethoxyanthracene, and tert-butyl anthracene-9-carboxylate (9TBAE), and the like are preferred π-electron donors.

Many π-electron acceptors are well-known in the art including, but not limited to 1,2,4,5-tetracyanobenzene (TCNB), 2,3,5,6-fluoroterephthalonitrile, halogenated benzoquinones including but not limited to tetrachloro-, tetrafluoro-, and tetrabromobenzoquinone, tetracyanobenoquinone, pyrazine, pyrimidine, pyridazine, pyromellitic diimide, 1,4,5,8-tetracarboxydiimidenaphthalene, derivatives thereof and the like.

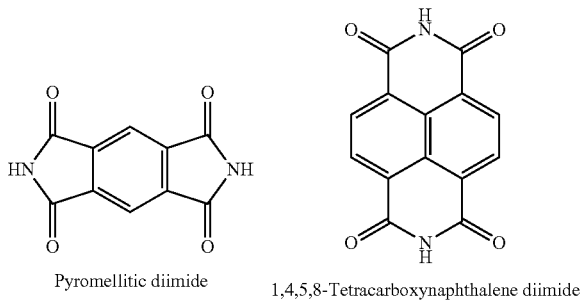 [SMILES: O=c1[nH]c(=O)c2cc3c(=O)[nH]c(=O)c3cc12 ; O=C1NC(=O)c2ccc3c4c(ccc1c24)C(=O)NC3=O]

Pyromellitic diimide 1,4,5,8-Tetracarboxynaphthalene diimide

In some embodiments, the π-electron acceptor is 1,2,4,5-tetracyanobenzene (TCNB) or 2,3,5,6-tetrafluoroterephthalonitrile (TFPN).

The crystal of the invention may have a single hollow cavity or multiple hollow cavities. It may be of any geometrical shape such as, but not limited to a triangular, rectangular, hexagonal rod shape, a triangular, rectangular, or hexagonal sheet, tetrahedron, octahedral, trigonal or hexagonal bipyramid shaped and the like. The crystal may vary in dimension by varying the temperature, the concentration of π-electron acceptor and donor and surfactant, and the mixing intensity during crystallization as described below. In some embodiment, the crystal length is preferably at least 2 cm, 1 cm, 0.5 cm, 0.4 cm, 0.3 cm, 0.2 cm, 0.1 cm, 90 μm, 80 μm, 70 μm, 60 μm, 50 μm, 40 μm, 30 μm, 20 μm, 10 m or smaller. The width of the crystal is preferably at least cm, 0.5 cm, 0.2 cm, 0.1 cm, 50 μm, 25 μm, 10 μm, 6 μm, 4 μm, 2 μm, or less. The number of cavities is preferably at least one, preferably two, preferably three, preferably four, preferably five in each single crystal. The total volume of the cavity or cavities van vary in the range of 60% to 5%, preferably in the range 40% to 15, preferably in the range of 30% to 20% of the total volume of the crystal.

In particular embodiment, the CT hollow crystal comprises 9-MA or naphthalene as π-electron donor and TCNB or TFPN as π-electron acceptor.

A second aspect of the invention is directed to a method of preparing a hollow charge transfer co-crystal comprising:

mixing optionally saturated solutions of a π-electron donor and a π-electron acceptor with a non-ionic surfactant, preferably aqueous surfactant, to form a mixture at a temperature in the range of 0-90° C., and incubating the mixture at the temperature for a time effective for the formation of the crystal.

Any non-ionic surfactant may be utilized in the method to obtain the crystal of the invention. Exemplary nonionic surfactants include, but are not limited to, alkyl poly(ethylene oxide), alkylphenol poly(ethylene oxide), copolymers of poly(ethylene oxide) and poly(propylene oxide), commercially known as Poloxamers or Poloxamines, polyoxyethylene octyl phenyl ether (TRITON X-100®), alkyl polyglucosides, for example, octyl glucoside and decyl maltoside, fatty alcohols, for example, cetyl alcohol and oleyl alcohol, cocamide MEA, cocamide DEA, and polysorbates (commercially known as TWEEN 20, TWEEN 80), for example, dodecyl dimethylamine oxide.

The amount of surfactant used in the method is preferably constant in the initial solutions and in the crystallization solution, and is dependent on the critical micelle concentration, micelle aggregation number, and the amount of electron donor and acceptor to be solubilized in a solvent medium such as an aqueous medium. In general, the amount of non-ionic surfactant used in the method must be well above the critical micelle concentration and sufficient to solubilize the electron donor and acceptor in quantities sufficient for successful formation of the charge transfer crystal. For polymeric surfactant, the surfactant used in the method is at a concentration in the range 0.001 wt. % to 0.5 wt. %, preferably 0.003 wt. % to 0.3 wt. %, preferably 0.005 wt. % to 0.2 wt. %, preferably 0.01 wt. %-0.1 wt % of the total weight of the aqueous solution. Alternatively, the concentration of the surfactant may be in the range of 0.005 to 0.50 M, preferably in the range of 0.01 M to 0.30 M, preferably in the range of 0.02 to 0.20M, preferably 0.025 M.

In some embodiments, the surfactant used in the method is a poloxamer having the general formula:

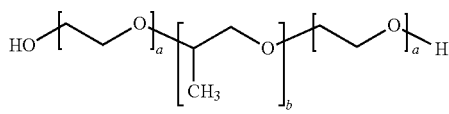

a = 2-130 and b = 15-67 wherein a is in the range of 2-130, preferably in the range 10-115, preferably in the range 20-100, preferably in the range 30-0, and preferably in the range 40-60, and b is in the range of 15-67, preferably in the range 20-55, preferably in the range 25-45, and preferably in the range 30-40. Poloxymers are nonionic triblock copolymers composed of a central hydrophobic chain of polyoxypropylene (poly(propylene oxide)) flanked by two hydrophilic chains of polyoxyethylene (poly(ethylene oxide)). Poloxamers are also known by the trade names Synperonics, Pluronics, and Kolliphor.

Because the lengths of the polymer blocks can be customized, many different poloxamers exist. Each poloxamer has different properties. For the generic term "poloxamer", the copolymers are commonly named with the letter "P" followed by three digits: the first two digits multiplied by 100 give the approximate molecular mass of the polyoxypropylene core, and the last digit multiplied by 10 gives the percentage polyoxyethylene content, e.g. P407 is a poloxamer with a polyoxypropylene molecular mass of 4000 g/mol and a 70% polyoxyethylene content. For the Pluronic and Synperonic tradenames, coding of these copolymers starts with a letter to define its physical form at room temperature, "L" for liquid, "P" for paste, and F for flake (solid) followed by two or three digits, The first digit or two digits in a three-digit number in the numerical designation, multiplied by 300, indicates the approximate molecular weight of the hydrophobic copolymer and the last digit×10 gives the percentage polyoxyethylene content (e.g., L61 indicates a polyoxypropylene molecular mass of 1800 g/mol and a 10% polyoxyethylene content. In the example given, poloxamer 181 (P181) is Pluronic L61 and Synperonic PE/L 61. In some embodiments, the poloxamer has a molecular mass of at least 1000 g/mol, preferably 1500 g/mol, preferably 2000 g/mol, preferably 2500 g/mol, preferably 3000 g/mol, preferably 4000 g/mol, preferably 4500 g/mol, preferably 5000 g/mol and having polyethylene in an amount of at least 5%, 10%, 15%, 20%, 25%, 30%, 40%, and even more of the total weight of the polymer.

An important characteristic of poloxamer solutions is their temperature dependent self-assembling and thermogelling behavior. Concentrated aqueous solutions of poloxamers are liquid at low temperature and form a gel at higher temperature in a reversible process. The transitions that occur in these systems depend on the polymer composition, i.e., molecular weight and hydrophilic/hydrophobic molar ratio.

At low temperatures and concentrations below the critical micelle temperature and critical micelle concentration, individual block copolymers (unimers) are present in solution. Above these values, aggregation of individual unimers occurs in a process called micellization. This aggregation is driven by the dehydration of the hydrophobic polyoxypropylene block that becomes progressively less soluble as the polymer concentration or temperature increases. The aggregation of several unimers occurs to minimize the interactions of the polyoxypropylene blocks with the aqueous medium. Thus, the core of the aggregates is made from the insoluble blocks (polyoxypropylene) while the soluble portion (polyoxyethylene) forms the shell of the micelles. Besides spherical micelles, elongated or worm-like micelles can also be formed. The final geometry will depend on the entropy costs of stretching the blocks, which is directly related to their composition, i.e., size and polyoxypropylene/polyoxyethylene ratio.

With higher increments of the temperature and/or concentration, micelles with other geometries may form including, but not limited to, highly ordered mesophases such as cubic, hexagonal and lamellar. Eventually, a complete dehydration of the polyoxypropylene blocks and the collapse of the polyoxyethylene chains will lead to clouding and/or macroscopic phase separation. This is due to the fact that hydrogen bonding between polyoxyethylene and water molecules breaks down at high temperature and polyoxyethylene becomes insoluble in water.

The phase transitions can also be largely influenced by the use of additives such as salts and alcohols. The interactions with salts are related to their ability to act as water structure makers (salting-out) or water structure breakers (salting-in). Salting-out salts increase the self-hydration of water through hydrogen bonding and reduce the hydration of the copolymers, thus reducing the critical micelle temperature and critical micelle concentration. Salting-in electrolytes reduce the water self-hydration and increase the polymer hydration, therefore increasing the critical micelle temperature and critical micelle concentration. The different salts have been categorized by the Hofmeister series according to their 'salting-out' power.

The critical micelle concentration can be determined under any condition by well-known methods that include but not limited to electric conductivity, surface tension measurements, catalytic activity, and optical density at various concentration of the surfactant. It is a physical property of each surfactant at a given conditions. At room temperature, a useful surfactant to be used in the method of the invention would have a critical micellar concentration in the range of 0.0005 wt. % to 0.5 wt. %, preferably in the range of 0.001 wt. % to 0.25 wt. %, preferably in the range of 0.002 wt. % to 0.1 wt. %, preferably in the range of 0.005 wt. % to 0.05 wt. % by weight of the total weight of the solution.

The temperature of the solutions has an effect of the size of the co-crystal formed and needs to be determined for each combination of electron donor and acceptor as well as for the surfactant used. In some embodiments, the mixing and crystallization temperature are the same and used in the method is in the range of 0-90° C., preferably in the range of 10-80° C., preferably 20-60° C., preferably 37-47° C., preferably about 47° C.

The incubation time is the time required for the formation of crystals and may vary depending on the crystal being formed, the incubation temperature, and the surfactant being used. In some embodiments, the crystals appear immediately after mixing and grow to the desired size in a time in the range of 10 min. to 4 h. In other embodiments, the crystal growth may require more than 5 h, more than 8 h, more than 12 h, more than 16 h, or more than 20 h.

In some embodiments, the charge transfer crystals obtained from a first crystallization, i.e., a first generation G1, that have at least one sealed compartment may be utilized as seed crystals to obtain a second generation G2 crystal having at least two sealed cavities. The second generation crystal typically has a similar morphology to that of the first generation crystal, but the number cavities preferably increases by at least one, two or three cavities. Similarly, a second generation crystal may be used to seed a third generation G3 crystal leading to a crystal with, for example, 3, 4 5 or 6 cavities.

A third aspect of the invention is directed to a charge transfer hollow co-crystal comprising a π-electron donor and π-electron acceptor having two or more sealed cavities with the proviso that the π-electron donor and π-electron acceptor are not 9-methylanthracene (9-MA) and 1,2,45-tetracyanobenzene, respectively (TCNB). The charge transfer crystal of the invention may have any combination of other electron donor and acceptor described herein.

In some embodiments, the electron donor is optionally substituted naphthalene, phnenathrene, pyrene, and chrysene. Also, anthracene derivatives such as, but not limited to 9-methylanthracene (9-MA), 9-methoxyanthracene (MXA), tert-butyl anthracene-9-carboxylate (9TBAE), and 9,10-dimethylanthracene, can be used as donors to prepare the co-crystal of the invention in combination with the π-electron acceptor such as but not limited to 1,2,4,5-tetracyanobenzene (TCNB) or 2,3,5,6-tetrafluoroterephthalonitrile (TFPN). Another preferred embodiment of the co-crystal of the invention is the blue fluorescent co-crystal of naphthalene and the π-electron acceptor is TCNB.

The crystal of the invention may have at least two hollow compartments or multiple hollow compartments. The number of compartments is preferably at least two, preferably at least four, preferably at least six, preferably at least eight.

A fourth aspect of the invention is directed to a method of preparing the hollow crystal of comprises:

mixing preferably saturated solutions of π-electron donor and π-electron acceptor with an ionic surfactant, preferably an aqueous ionic surfactant solution, to form a mixture at a temperature in the range of 20-50° C., and incubating the mixture at a temperature for a time sufficient to form crystals having one or more cavities.

Any combination of an electron donor and an electron acceptor disclosed herein or known in the prior art may be utilized in the method by preparing saturated solutions of electron donor and electron acceptor in an aqueous ionic surfactant solution. As used herein, the phrase "saturated solution" has the well-accepted meaning in the art of the phrase. A saturated solution can be prepared by contacting a solvent with an increasing amount of solute until no further dissolution of the solute is observed. Any synthetic or biological ionic surfactant may be used in the method. The ionic surfactant may be anionic, cationic, or zwitterionic surfactant. Exemplary anionic surfactants include but not limited to sulfate, sulfonate or carboxylate anions, such as, but not limited to perfluorooctanoate (PFO), perfluorooctanesulfonate (PFOS), sodium dodecyl sulfate (SDS), ammonium lauryl sulfate, and other alkyl sulfate salts, sodium laureth sulfate (also known as sodium lauryl ether sulfate (SLES)), alkyl benzene sulfonate, and fatty acid salts. Examples of cationic surfactant are based on quaternary ammonium cations and include, but not limited to tetrapropylammonium hydroxide, tetraethylammonium hydroxide, tetrabutylammonium hydroxide, tetrapentylammonium hydroxide, cetyl trimethylammonium bromide (CTAB) (also known as hexadecyl trimethyl ammonium bromide), and other alkyltrimethylammonium salts, cetylpyridinium chloride (CPC), polyethoxylated tallow amine (POEA), benzalkonium chloride (BAC), and benzethonium chloride (BZT). Zwitterionic (amphoteric) surfactants include but not limited to for dodecyl betaine, cocamidopropyl betaine, and coco ampho glycinate. Any concentration above the critical micelle concentration and sufficient to solubilize the electron donor and acceptor in sufficient quantity to produce the co-crystal may be used in the method. In some embodiment, the ionic surfactant is at a concentration in the range of 0.001 M to 0.5 M, preferably in the range of 0.005 M to 0.3 M, preferably in the range of 0.01 M to 0.2 M, preferably in the range of 0.02 M to 0.1 M, preferably 0.025 M. In a particularly preferred embodiment, the ionic detergent is sodium dodecyl sulfate.

The temperature of the donor and acceptor solution as well as the mixture solution has an effect of the size of the co-crystal formed and is determined for each combination of electron donor and acceptor as well as for the surfactant used. In some embodiment, the temperature used in the method is in the range of 10-70° C., preferably in the range of 25-65° C., preferably 30-55° C., preferably 37-47° C., preferably 47° C.

The incubation time is the time required for the formation of crystals and will vary depending on the crystal being formed, the incubation temperature, and the surfactant being used. In some embodiment, the crystals appear immediately after mixing and grow to the desired size in a time in the range of 10 min. to 4 h. In some other embodiments, the crystal growth may require more than 5 h, more than 8 h, more than 12 h, more than 16 h, more than 20 h.

In some embodiments, the charge-transfer crystal obtained from a first crystallization, a first generation, having two sealed compartments may be utilized as a seed crystal to obtain a second generation crystals having four sealed compartments. The second generation crystals have similar morphology to that of the first generation, but the number compartments increase by two. Similarly, a second generation crystal may be used to seed a third generation crystal leading to a crystal with six pockets.

A fifth aspect of the invention is directed to a method of controlling the dimensions of a charge transfer co-crystal and/or the dimensions of a sealed cavity present in the co-crystal comprising an electron donor and an electron acceptor comprising:

preparing a preferably saturated solution A of an electron donor in a surfactant solution, preferably an aqueous solution, at a predetermined temperature, preparing a preferably saturated solution B of an electron acceptor in an a surfactant solution, preferably an aqueous solution, surfactant solution at the predetermined temperature, mixing solution B with solution A to form a mixture, and agitating the mixture, e.g., sonicating the mixture and/or transferring the mixture from one container to another, to form crystals of particular dimensions.

The agitating step determines the size of the co-crystal produced. For example, the number of transfers between containers determines the dimension of the co-crystal. A smaller number of transfers produces larger crystals and a larger number of transfers produces smaller crystals. If large crystals are desired one or two transfers without shaking is effective for forming the largest crystal. On the other hand, sonication produces the smallest crystals.

EXAMPLES

Designing molecular crystals with exact shape, size and size distribution remains a challenge. The shape and crystal morphology of an organic crystal depends on the chemical composition, medium, and rate of crystallization. Solvent annealing inside hard inorganic templates such as anodic aluminum oxide (AAO) templates may provide highly crystalline cylindrical shaped nanowires or nanotubes. Co-precipitation of organic molecules from aqueous media, in many cases, leads to random aggregates of microcrystals with polymorphic crystal domains. A more common approach is to use a soft template to guide the crystallization process from an aqueous solution. The soft templates or crystal habit modifiers are formed by dissolving surfactants such as, but not limited to cetrimonium bromide (CTAB), Pluronic-F127, or SDS in aqueous media to yield either micellar or liquid crystalline amphiphils that act as soft templates. [Bakshi, M. S. "How Surfactants Control Crystal Growth of Nanomaterials" Cryst. Growth Des. 2016, 16, 1104-1133, doi:10.1021/acs.cgd.5b01465; Pileni, M.-P. "The role of soft colloidal templates in controlling the size and shape of inorganic nanocrystals" Nat. Mater. 2003, 2, 145-150, doi:10.1038/nmat817; and Bakshi. et al. "Dependence of crystal growth of gold nanoparticles on the capping behavior of surfactant at ambient conditions" Cryst. Growth Des. 2008, 8, 1713-1719, doi:10.1021/cg8000043]. Slow acid-catalyzed reaction methods inside aqueous surfactants produce long microwires, and complex highly branched molecular crystals with unique photomechanical properties [Al-Kaysi et al. (2015), and Al-Kaysi et al. (2017). In all reported examples, a single molecule component was used to give uniform shaped crystals with modified habit.

Example 1

Materials:

9-Mehtylanthracene (9-MA), Naphthalene (NP), Pyrene (Py), 1,2,4,6-Tetracyanobenzene (TCNB), and Sodium Dodecyl Sulfate (SDS) were purchased from Sigma-Aldrich and are >99% pure reagent grade. Deionized water (15 MG) was used. All aqueous surfactant solutions were filtered through a 0.2 micron nitrocellulose filter. All glass vials were soaked in hot chromic acid/concentrated sulfuric acid bath for 30 minutes then thoroughly rinsed with deionized water, and dried in a dust free area. Optical microscopy measurements were conducted using an Optika model fluorescence microscope. Images were captured using Optikam-B9 10 megapixel camera fitted through the microscope eyepiece. Microscope objectives were calibrated using a stage micrometer. Fluorescence spectra were collected using an Ocean optics spectrophotometer with a fiber optics lead attached to the microscope eyepiece. The excitation wavelength was adjusted to 365 nm.

Example 2

Figure 1B:
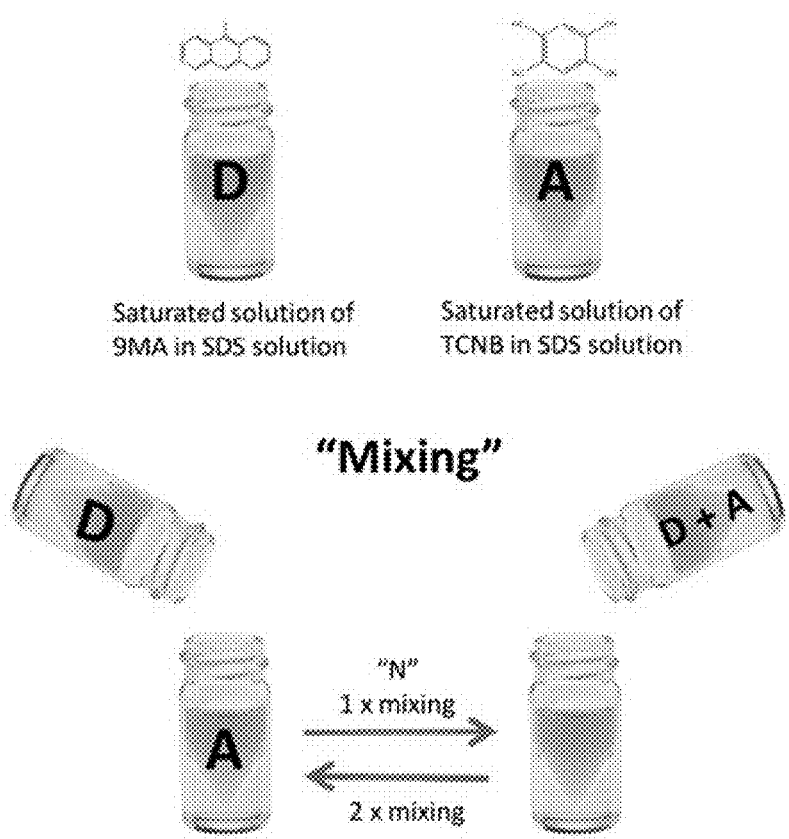
FIG. 1B shows steps of making the charge-transfer co-crystals of the present disclosure by mixing saturated solutions of electron donor and acceptor in aqueous surfactant, and controlling the agitation of the mixture by pouring the mixture back and forth then incubating the mixture at a specific temperature.
Figure 2A:
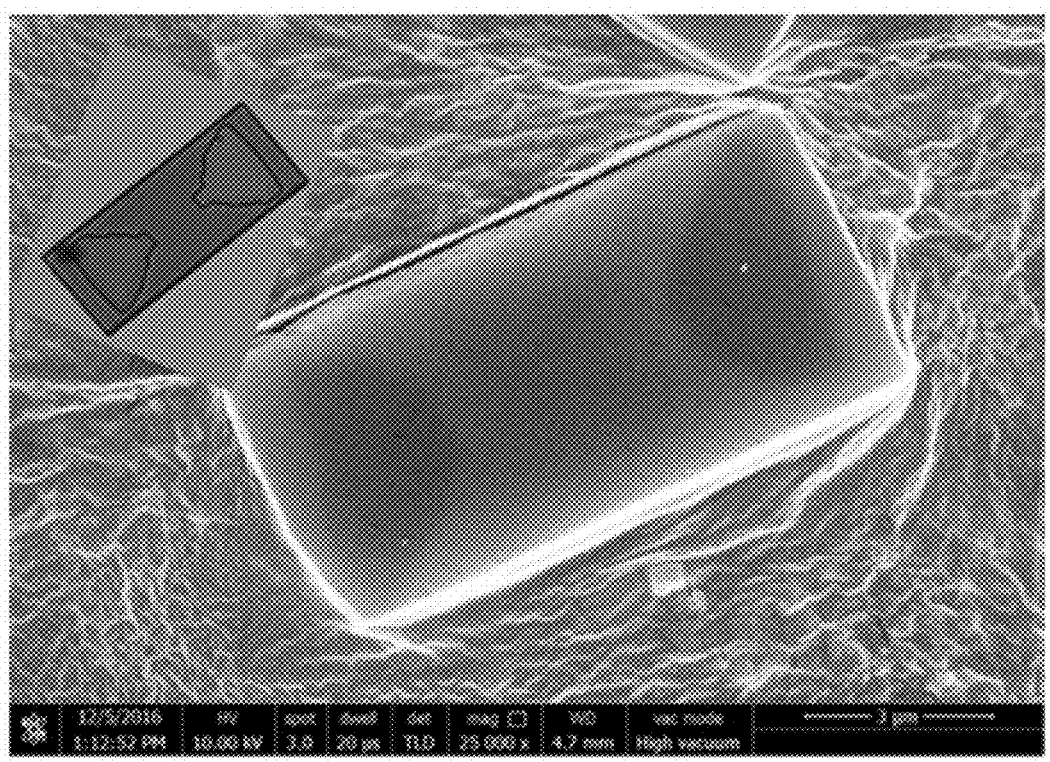
FIG. 2A shows scanning electron microscope (SEM) image of a single rectangular charge-transfer co-crystal of 9-methylanthracene (9-MA) and 1,2,4,5-tetracyanobenzene (TCNB) displaying shadows of the pockets visible due to variation in crystal thickness at magnification 25K. Inset, shows an optical microscope image of a similar charge-transfer co-crystal with the triangular pockets visible.
Figure 2B:
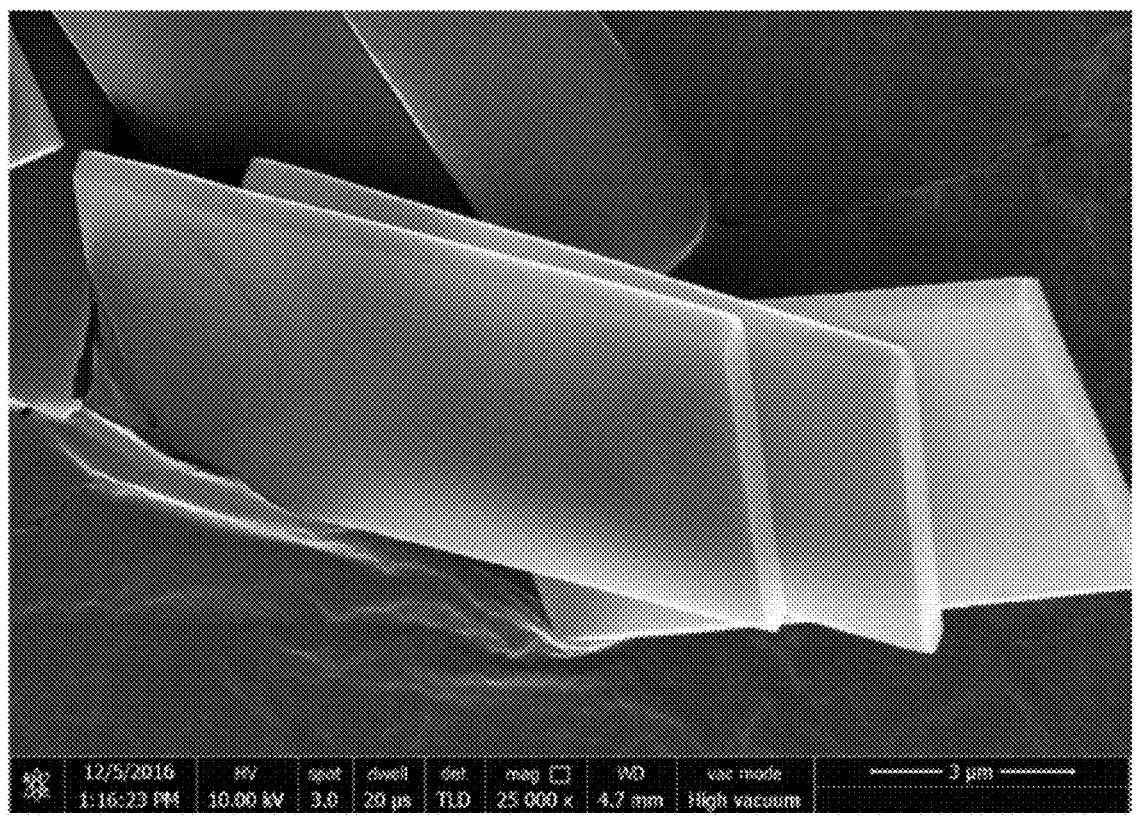
FIG. 2B shows SEM image of charge-transfer co-crystals of 9-methylanthracene (9-MA) and 1,2,4,5-tetracyanobenzene (TCNB) lying on their side illustrating the thickness and edge shape of the co-crystals at magnification 25K.
Figure 2C:
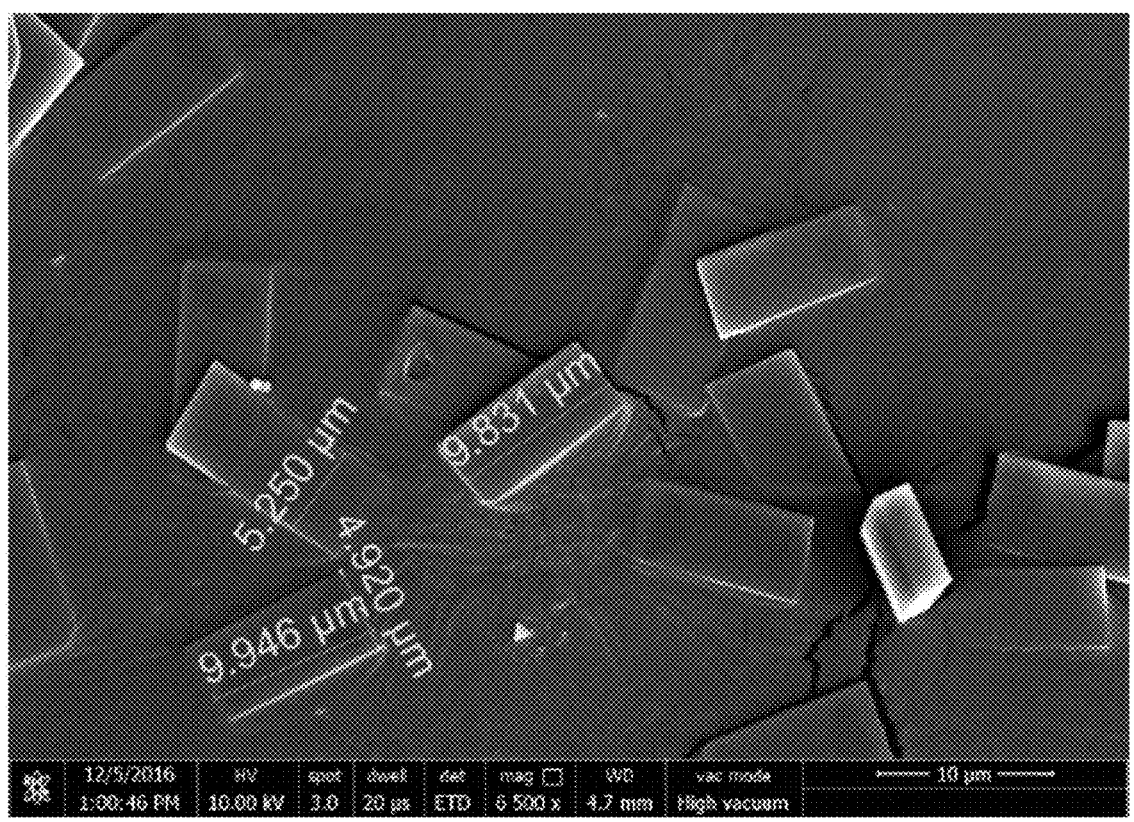
FIG. 2C shows SEM image of charge-transfer co-crystal cluster of 9-methylanthracene (9-MA) and 1,2,4,5-tetracyanobenzene (TCNB) demonstrating the uniform distribution of size and shape of the crystals at magnification 6.5K.
Figure 2D:
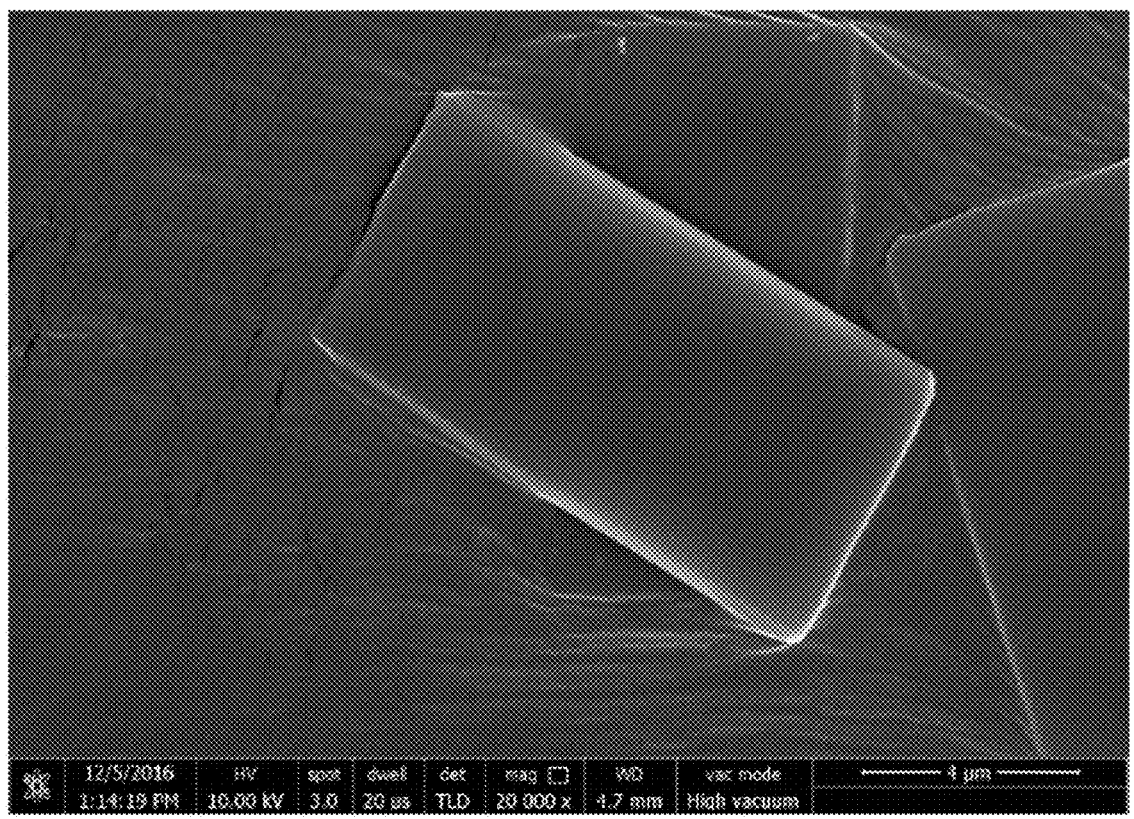
FIG. 2D shows SEM image of single charge-transfer co-crystals of 9-methylanthracene (9-MA) and 1,2,4,5-tetracyanobenzene (TCNB) displaying shadows of the pockets visible due to variation in crystal thickness at magnification 20K.
Figure 2E:
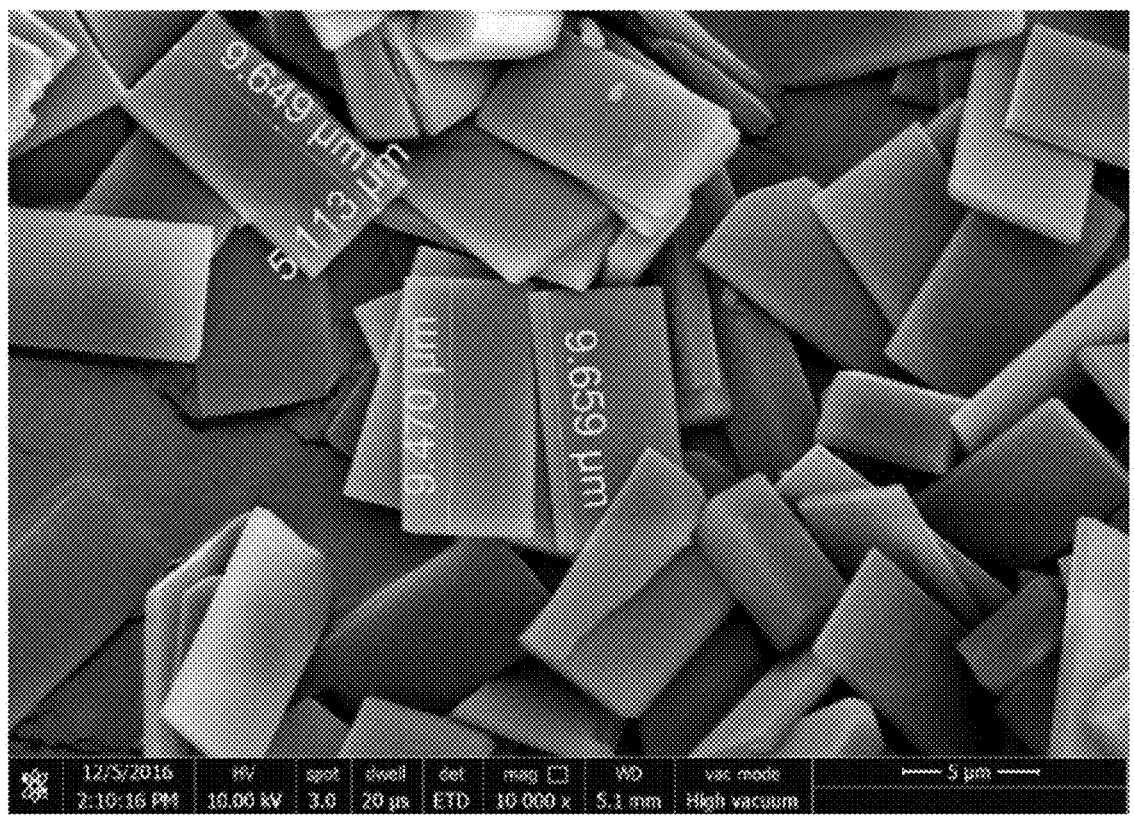
FIG. 2E shows SEM image of charge-transfer co-crystal cluster of 9-methylanthracene (9-MA) and 1,2,4,5-tetracyanobenzene (TCNB) at magnification 10K.
Figure 3A:
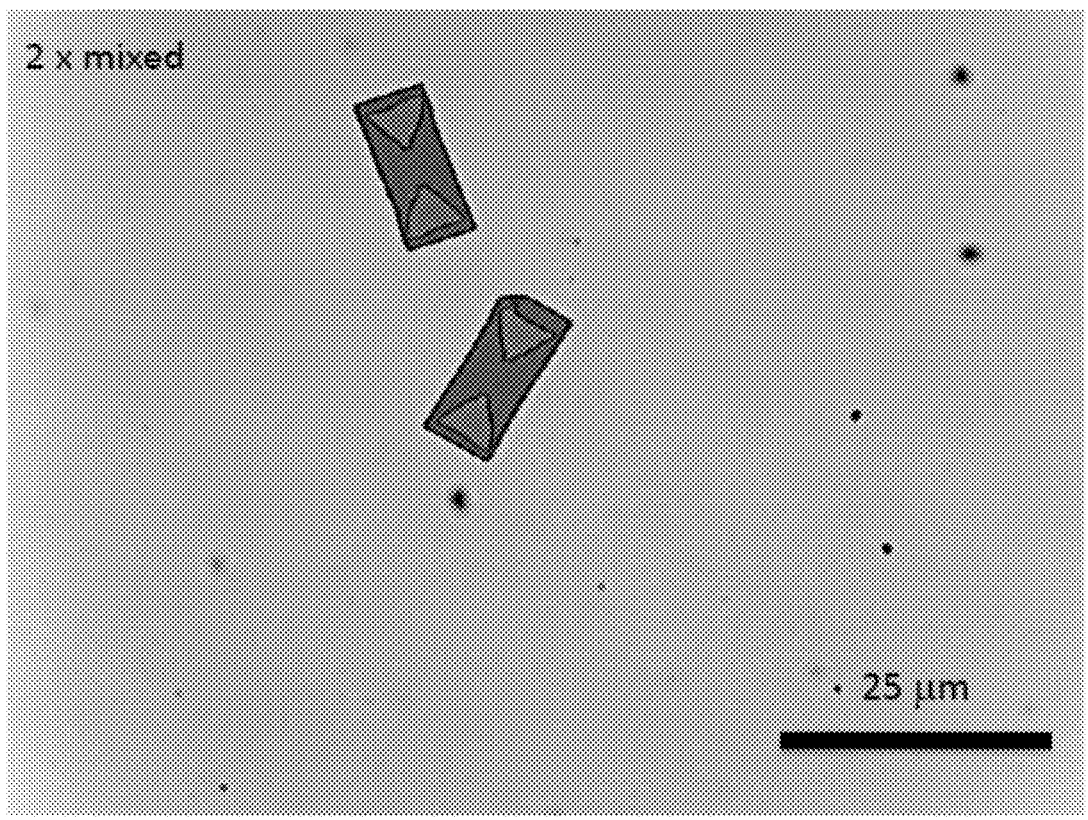
FIG. 3A shows optical microscope image of charge-transfer co-crystals formed by mixing 9-MA and TCNB in 0.025 M SDS solution and incubating at 37° C. The mixture was transferred from one vessel to another 2 times (see Figure description 1B).
Figure 3B:
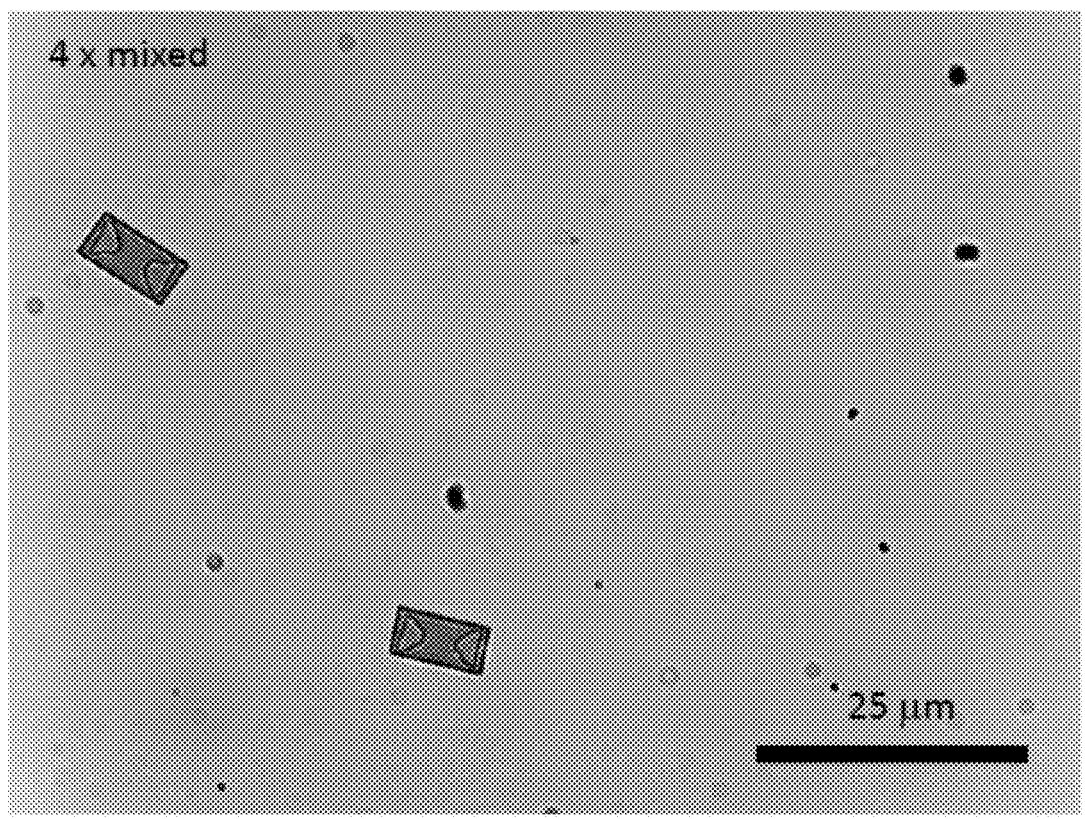
FIG. 3B shows optical microscope image of a charge-transfer co-crystals formed by mixing 9-MA and TCNB in 0.025 M SDS and incubating at 37° C. The mixture was transferred from one vessel to another 4 times (see Figure description 1B).
Figure 3C:
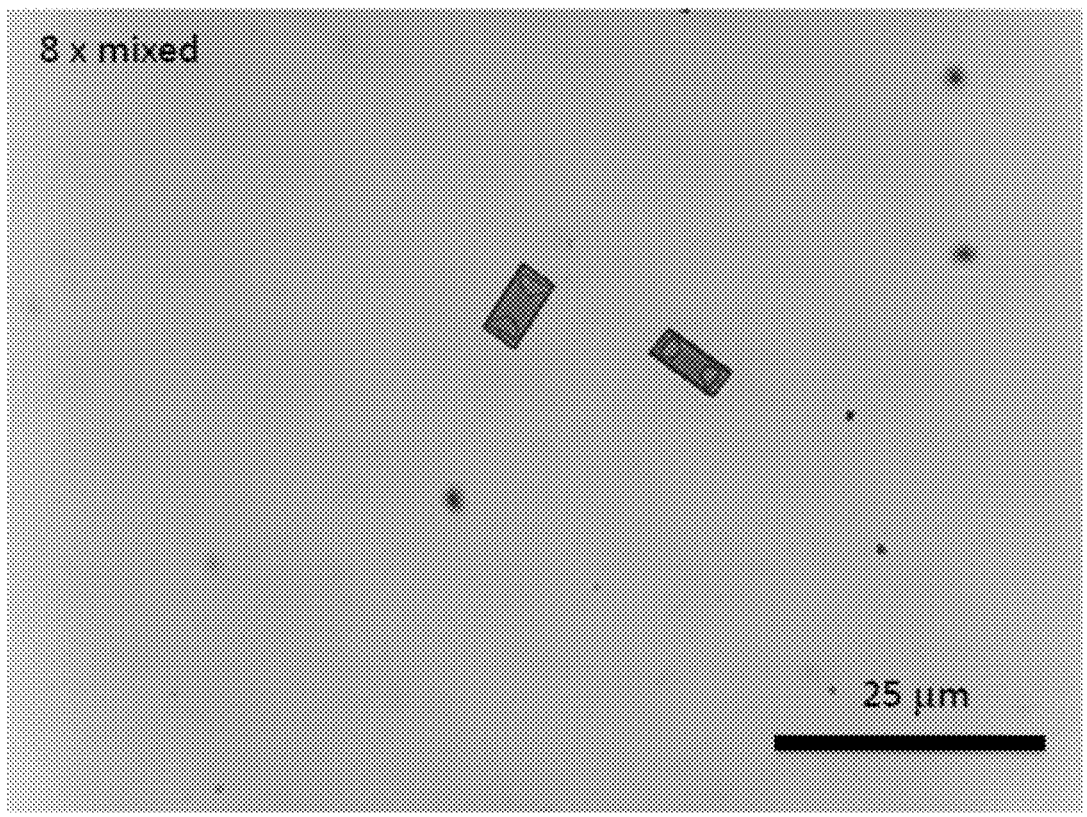
FIG. 3C shows optical microscope image of a charge-transfer co-crystals formed by mixing 9-MA and TCNB in 0.025 M SDS and incubating at 37° C. The mixture was transferred from one vessel to another 8 times (see Figure description 1B).
Figure 3D:
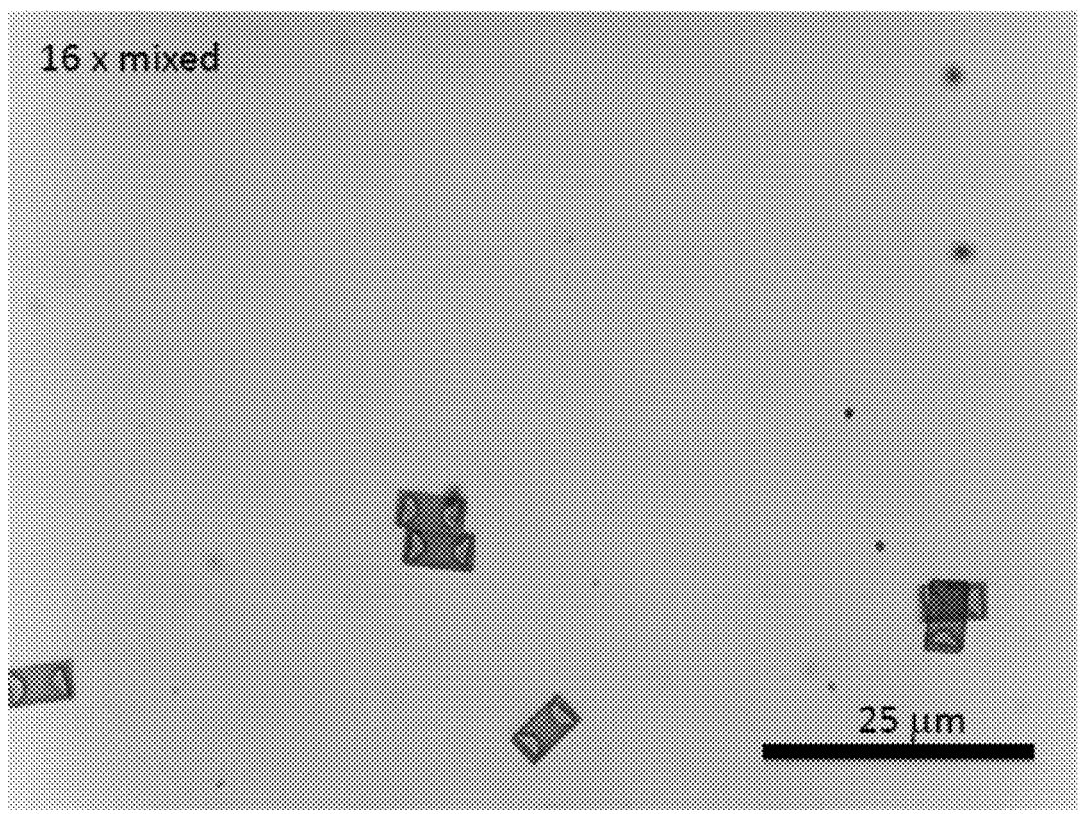
FIG. 3D shows optical microscope image of a charge-transfer co-crystals formed by mixing 9-MA and TCNB in 0.025 M SDS and incubating at 37° C. The mixture was transferred from one vessel to another 16 times (see Figure description 1B).
Figure 3E:
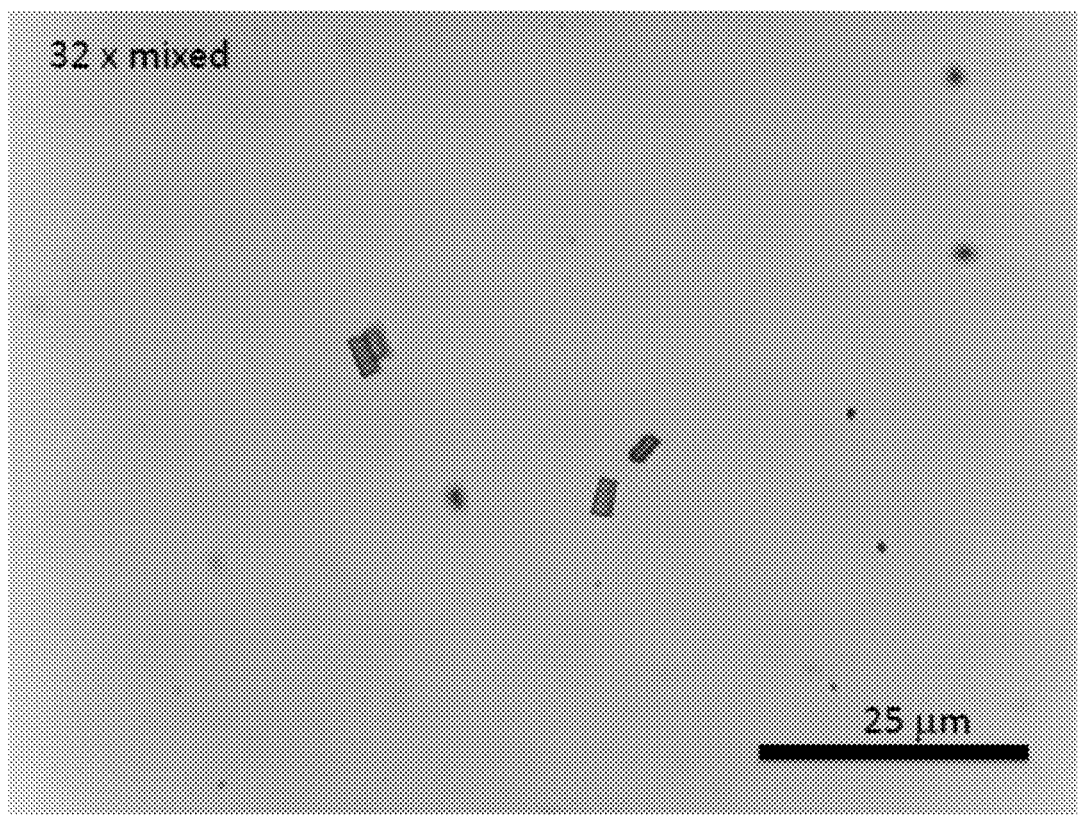
FIG. 3E shows optical microscope image of a charge-transfer co-crystals formed by mixing 9-MA and TCNB in 0.025 M SDS and incubating at 37° C. The mixture was transferred from one vessel to another 32 times (see Figure description 1B).
Figure 3F:
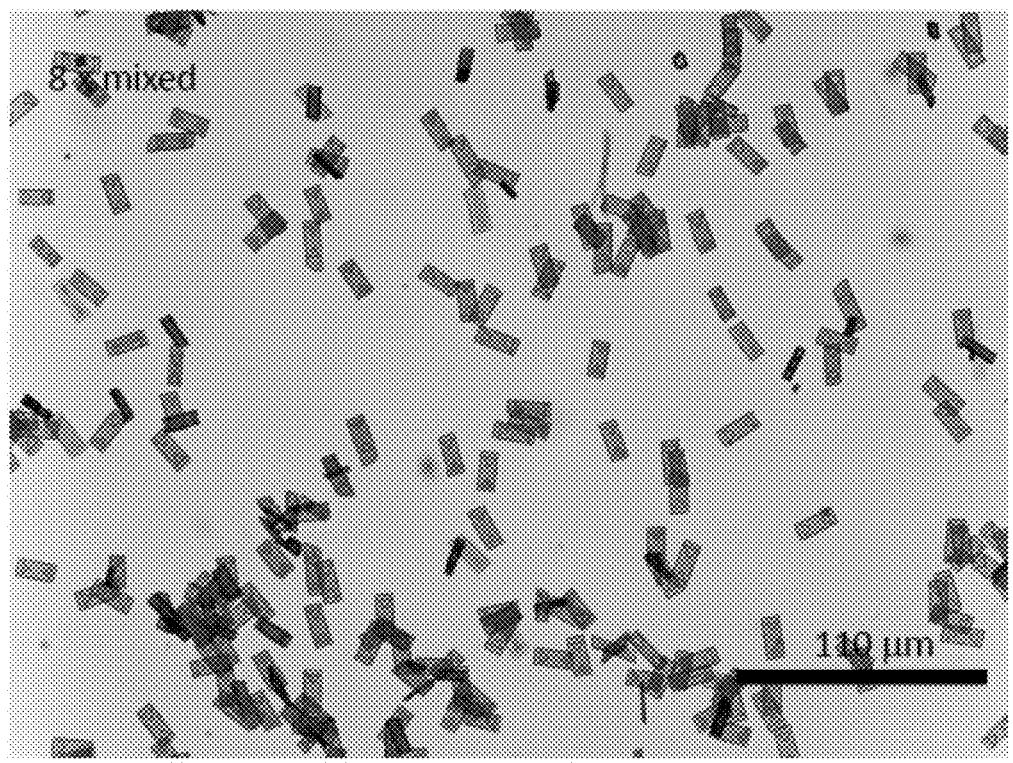
FIG. 3F shows optical microscope image at a lower magnification of charge-transfer co-crystals formed from 9-MA and TCNB in 0.025 M SDS solution and incubated at 37° C. The mixture was transferred from one vessel to another 8 times (see Figure description 1B). The image reveals the uniform size and shape distribution.
Figure 3G:
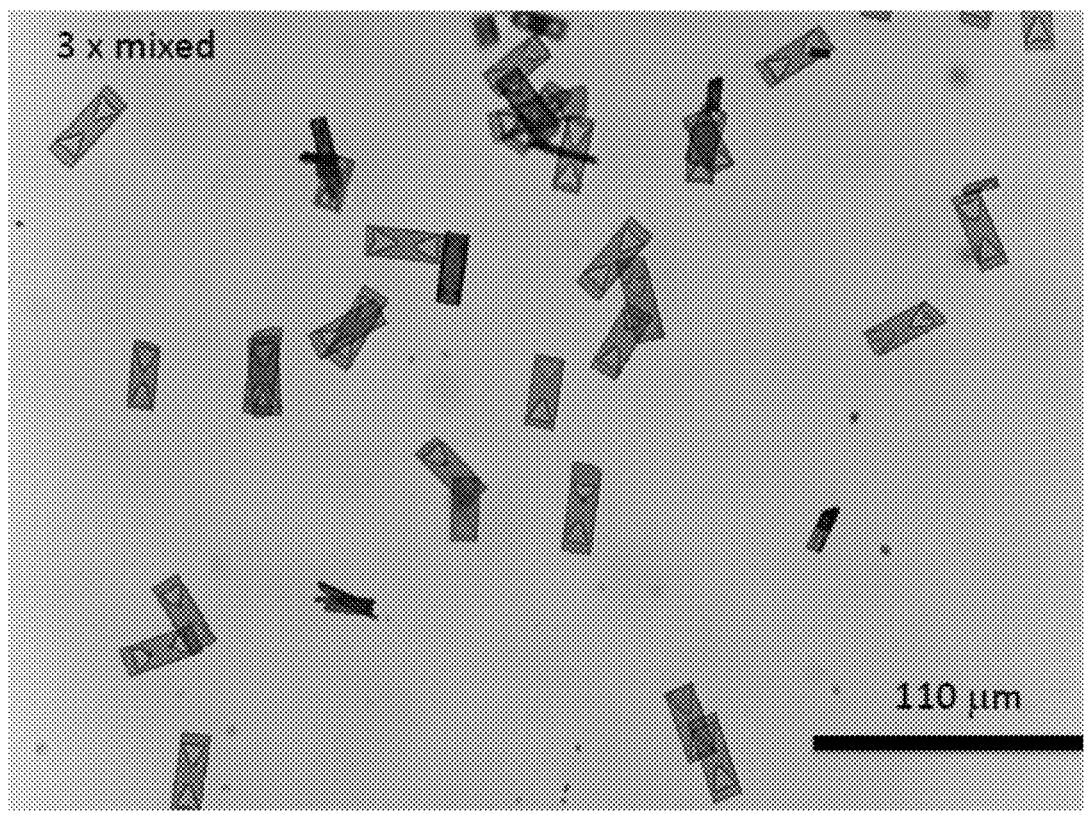
FIG. 3G shows optical microscope image at lower magnification of charge-transfer co-crystals formed from 9-MA and TCNB in 0.025 M SDS solution and incubated at 37° C., The mixture was transferred from one vessel to another 3 times (see Figure description 1B). The image reveals the uniform size and shape distribution.
Figure 4A:
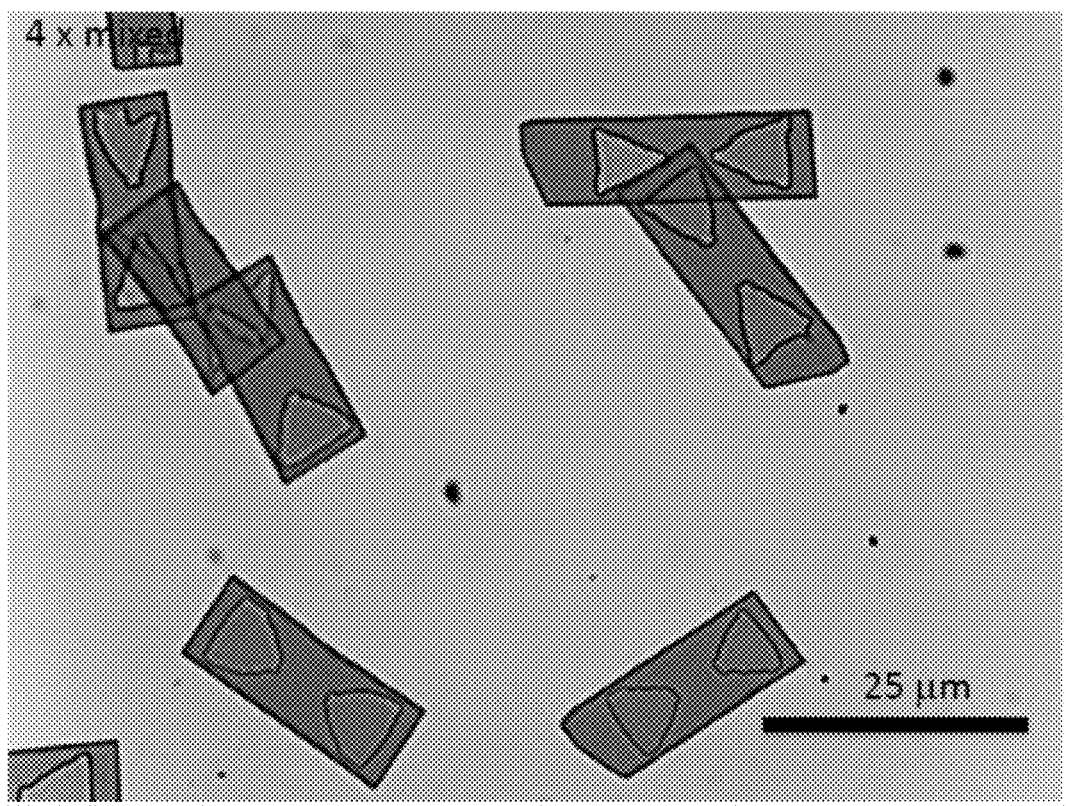
FIG. 4A shows optical microscope image of a charge-transfer co-crystals formed by mixing 9-MA and TCNB in 0.025 M SDS and incubating at 47° C. The mixture was transferred from one vessel to another 4 times (see Figure description 1B).
Figure 4B:
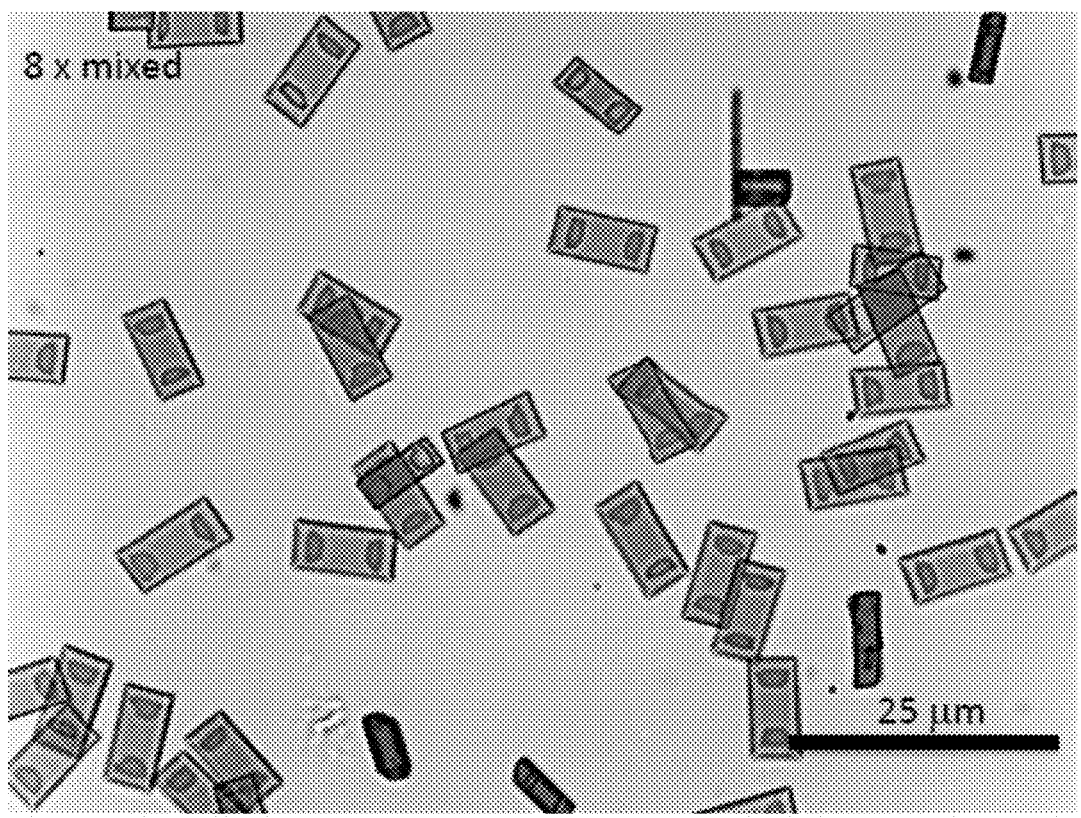
FIG. 4B shows optical microscope image of a charge-transfer co-crystals formed by mixing 9-MA and TCNB in 0.025 M SDS and incubating at 47° C. The mixture was transferred from one vessel to another 8 times (see Figure description 1B).
Figure 4C:
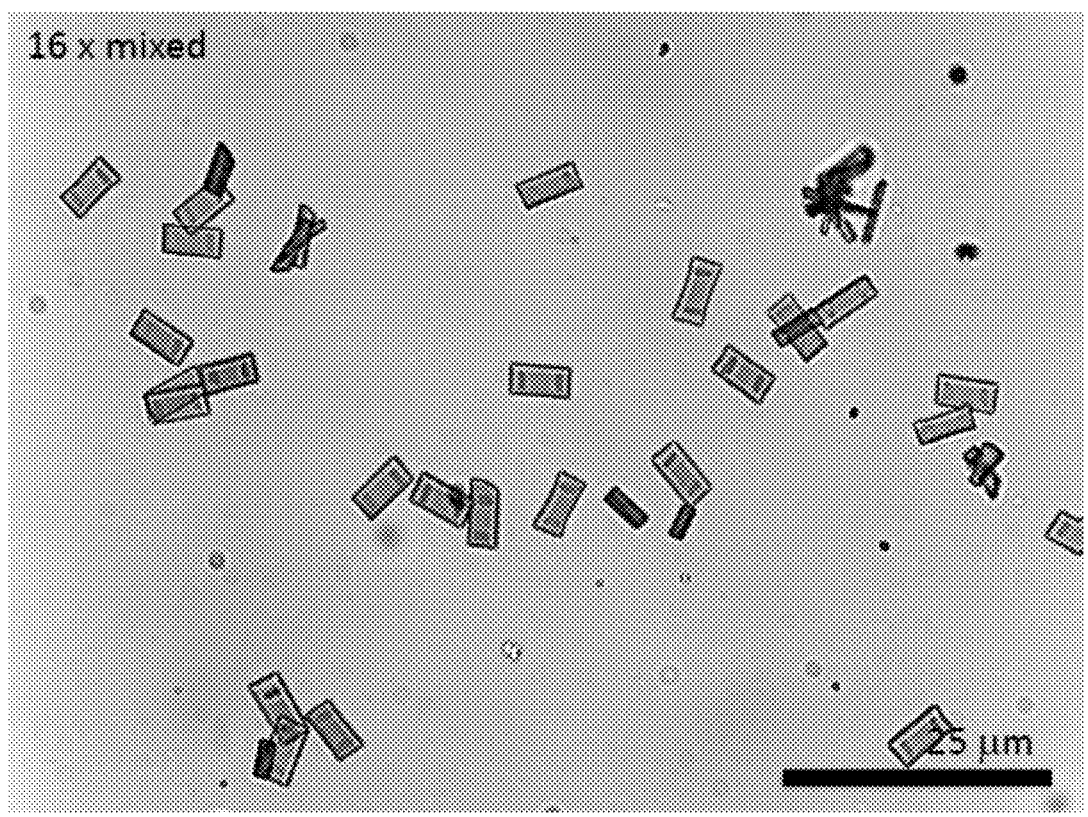
FIG. 4C shows optical microscope image of a charge-transfer co-crystals formed by mixing 9-MA and TCNB in 0.025 M SDS and incubating at 47° C. The mixture was transferred from one vessel to another 16 times (see Figure description 1B).
Figure 4D:
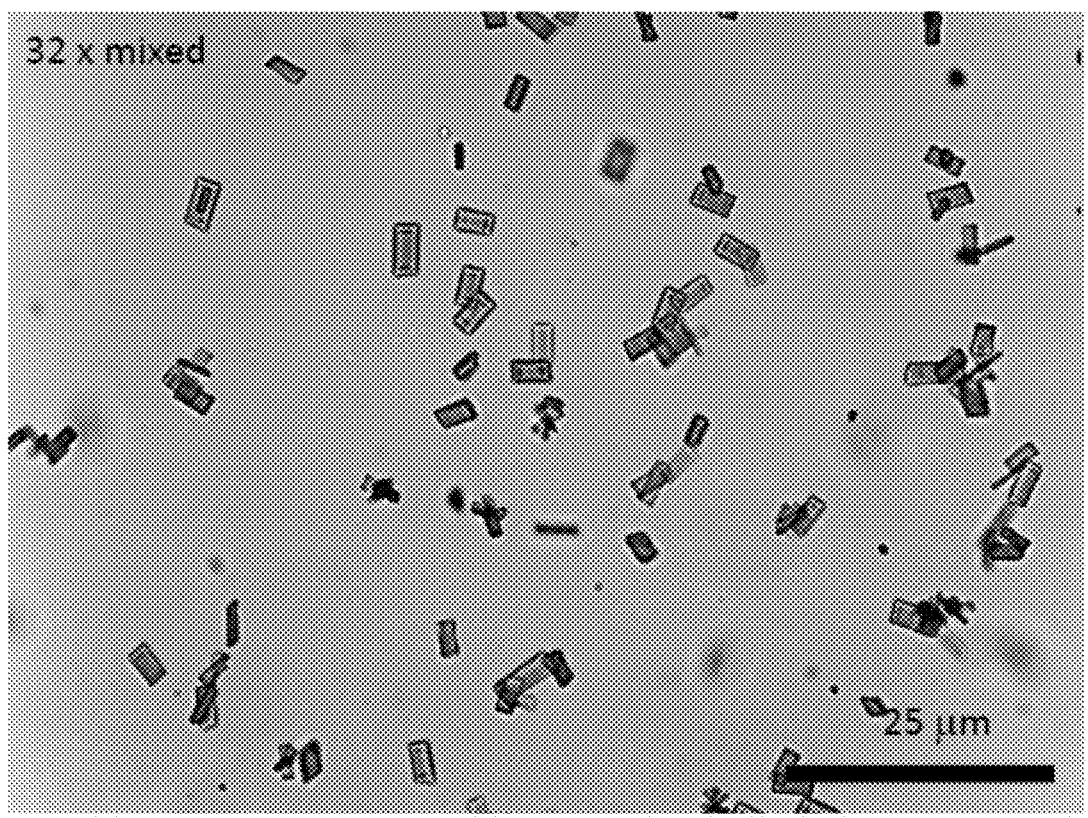
FIG. 4D shows optical microscope image of a charge-transfer co-crystals formed by mixing 9-MA and TCNB in 0.025 M SDS and incubating at 47° C. The mixture was transferred from one vessel to another 32 times (see Figure description 1B).
Figure 4E:
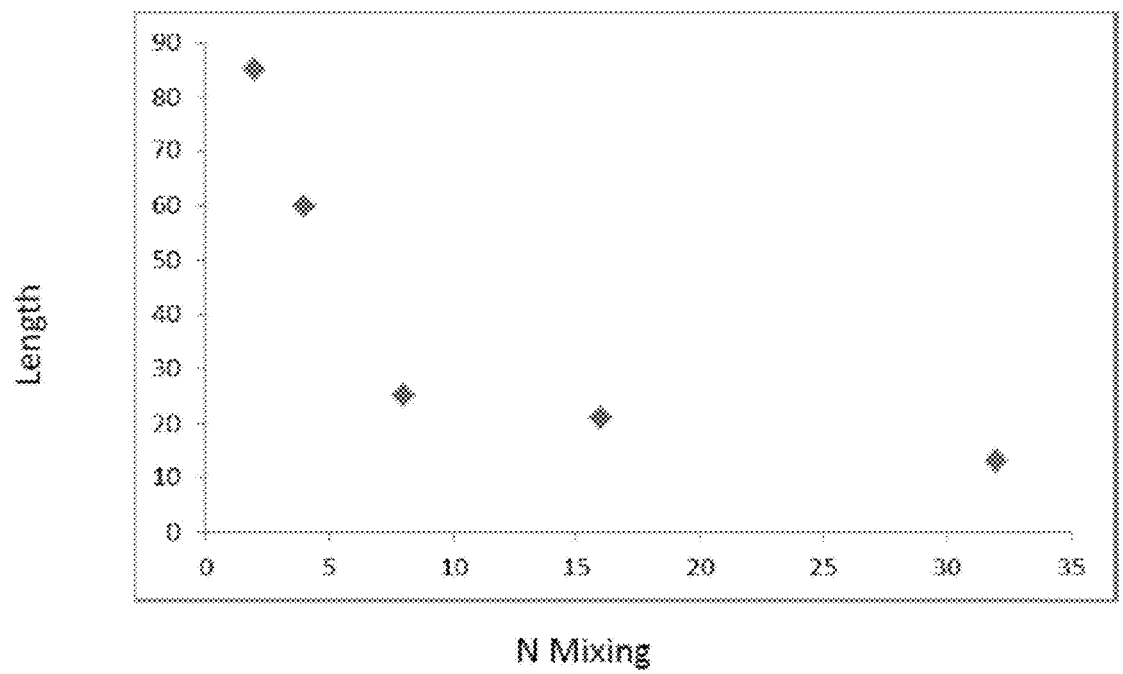
FIG. 4E shows the effect of the number of mixing on the length in microns of the 9-MA/TCNB charge-transfer co-crystal at 47° C.
Figure 4F:
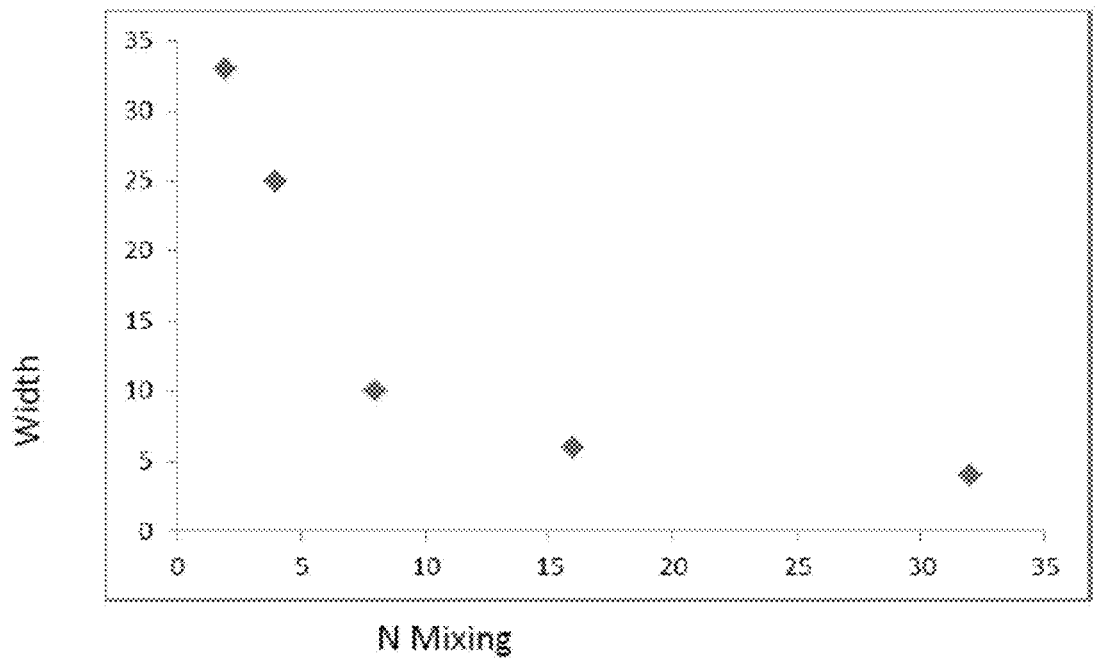
FIG. 4F shows the effect of the number of mixing on the width of the 9-MA/TCNB charge-transfer co-crystal in microns at 47° C.
Figure 5A:
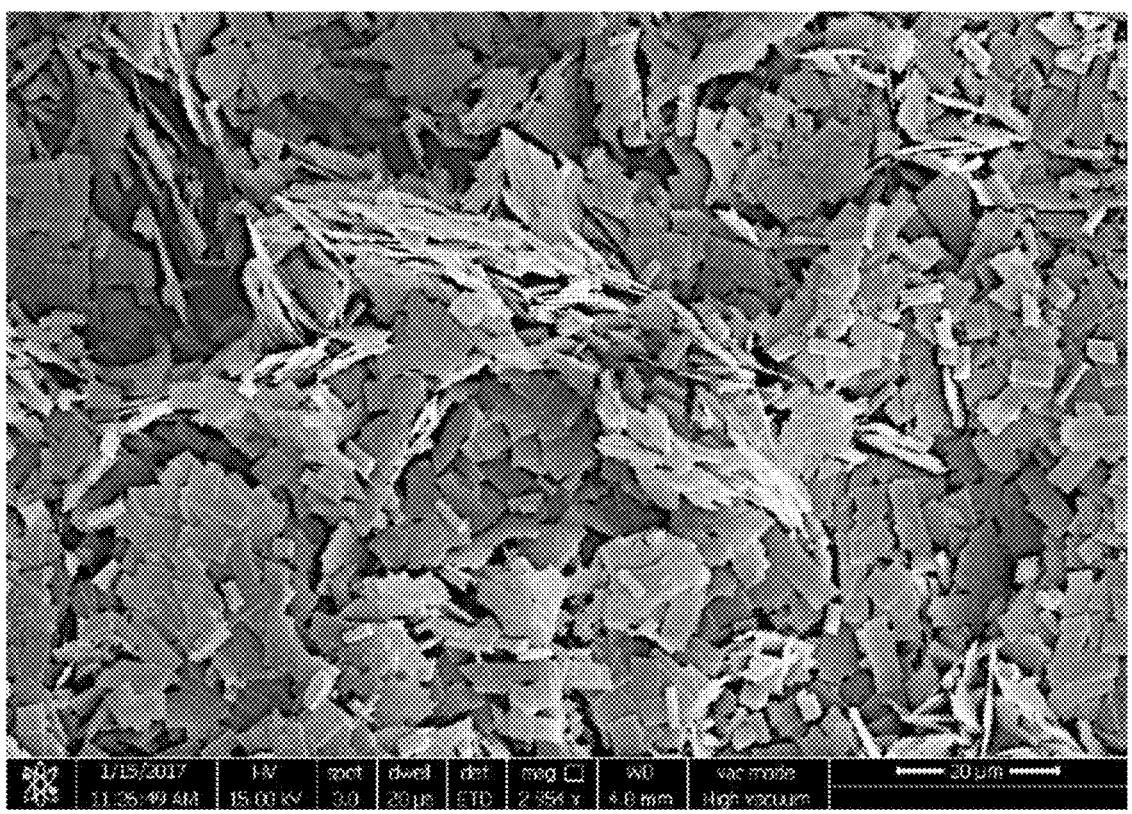
FIG. 5A show SEM image of the effect of sonication of mixtures of solution A and solution D in FIG. 1B at 47° C. leading to the formation of rectangular microsheets at magnification 2,900× with a Scale bar=20 μm.
Figure 5B:
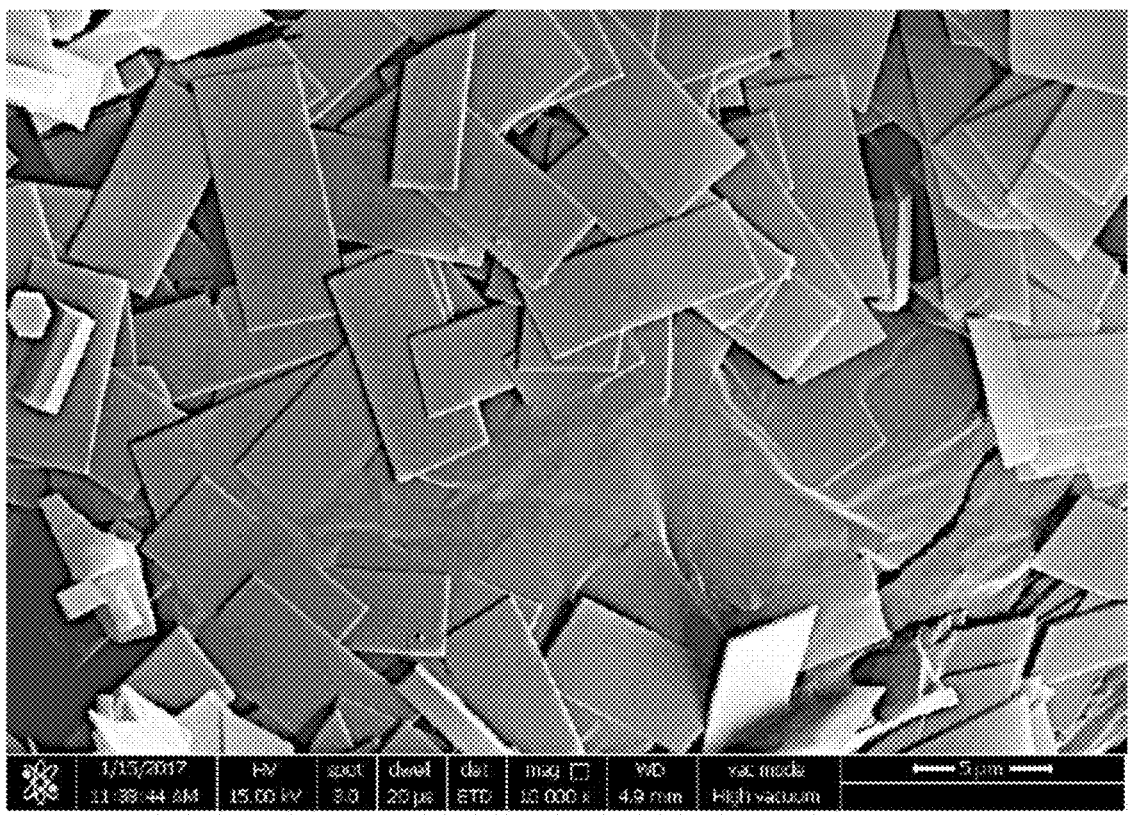
FIG. 5B show SEM image of the effect of sonication of mixtures of solution A and solution D in FIG. 1B at 47° C. leading to the formation of rectangular micro-sheets at magnification 10,000×, the scale bar shown in the image is 2 μm.

Methods:

CT Co-Crystal Formation:

Two vials (8 dram, ~30 mL capacity) were each filled with 10 mL of 0.025 M aqueous SDS solution and placed on a hot plate set at 47° C. After the temperature of the SDS solutions in vials labeled A (for acceptor) and D (for donor) equilibrated at 47° C., 25 µL of 0.22 molar TCNB and 0.22 M 9-MA solution in N,N-dimethylformamide (DMF) were each rapidly injected in their respective vials and stirred at 500 rpm for 10-20 S until the solutions were clear. In order to precipitate the charge-transfer co-crystals, the warm vials were mixed by rapidly transferring the contents of one vial into the other. The mixture was further transferred between the two vials a predetermined number of times (FIG. 1B). Thus, "4×" mixing means that the solutions were transferred back and forth a total of 4 times. The vial containing the mixture was quickly incubated undisturbed in a water bath or oven set at 47° C. for 3 to 6 hours. A red precipitate of uniform CT co-crystals blankets the bottom of the vial (FIG. 4A). To make smaller sized CT co-crystals, the vials were mixed 8× (FIG. 4B), 16× (FIG. 4C) or 32× (FIG. 4D). The more mixing the smaller and more uniform the CT co-crystals obtained (FIGS. 5A and 5B).

Growing $2^{nd}$ and $3^{rd}$ Generation CT Co-Crystals

Figure 9A:
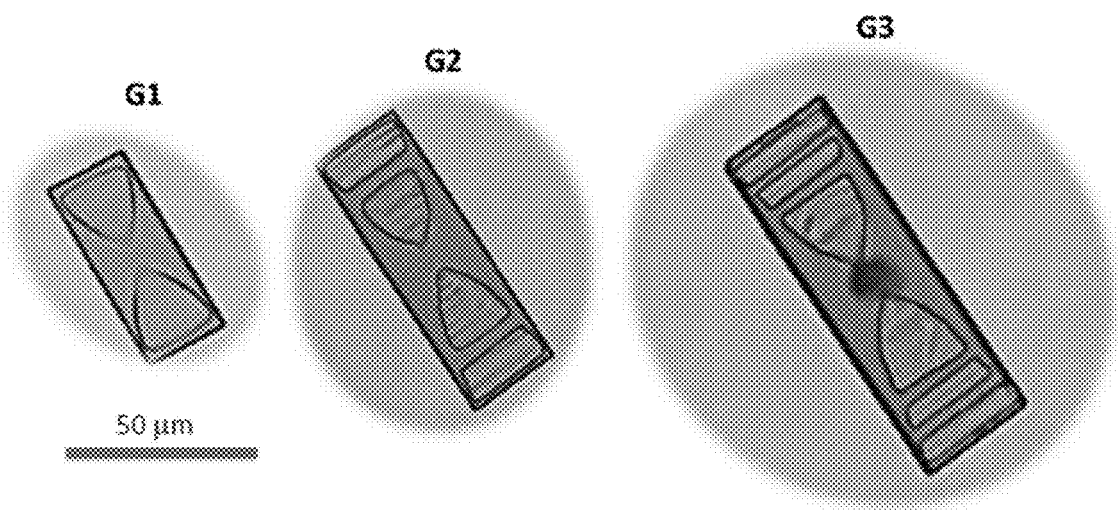
FIG. 9A shows optical microscope image of first generation, second generation, and third generation crystals G1, G2, and G3, respectively of CT co-crystals made from 9-MA and TCNB.
Figure 9B:
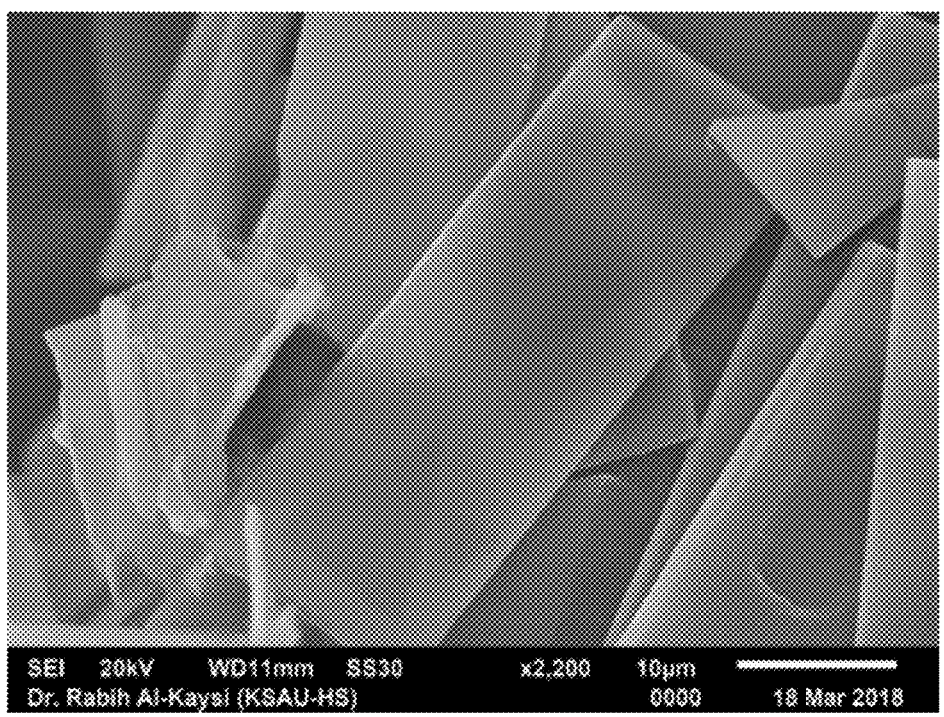
FIG. 9B shows a scanning electron microscopy (SEM) image of G3 charge-transfer co-crystal made from 9-MA and TCNB at magnification 2.3K.
Figure 9C:
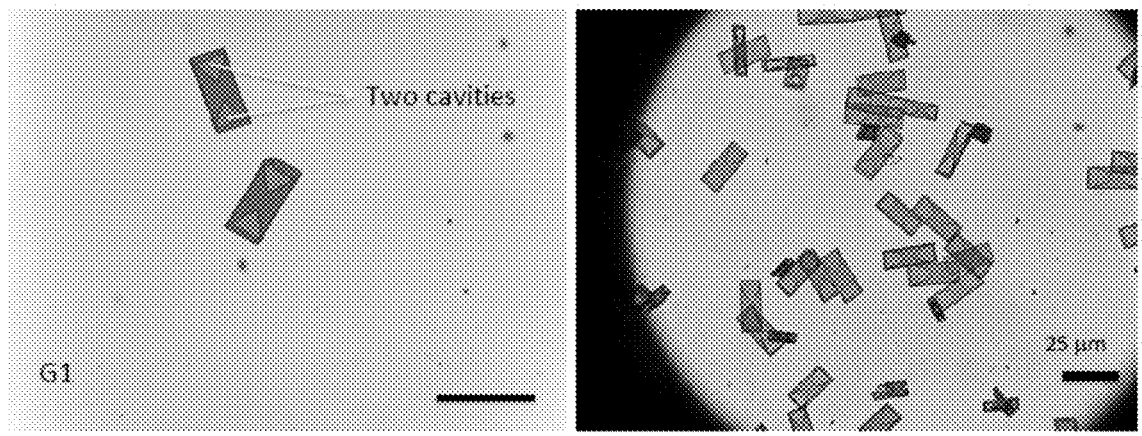
FIG. 9C left panel, shows optical microscope image of G1 charge-transfer co-crystals made from 4 times mixing of 9-MA and TCNB in 0.025 M SDS solution then incubated at 47° C., scale bar shown is 50 μm. Right panel shows a view at lower magnification G1.
Figure 9D:
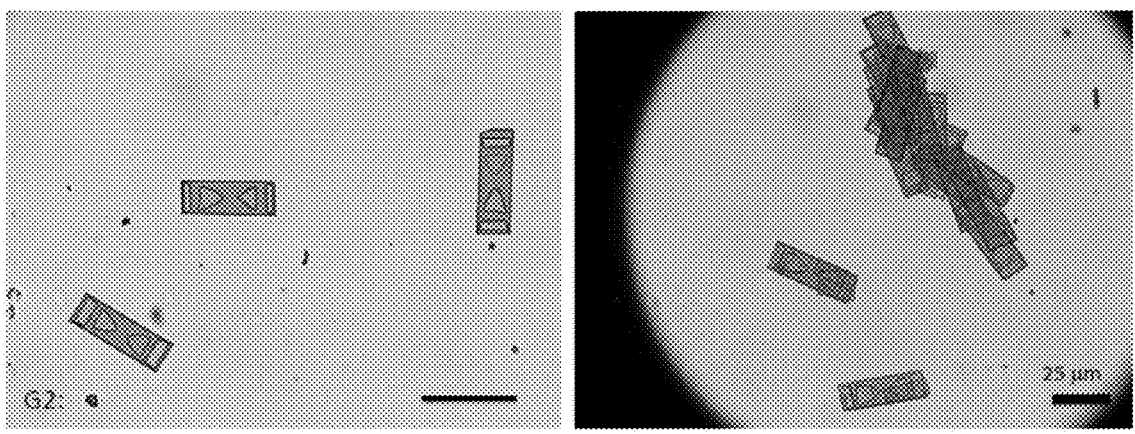
FIG. 9D left panel, shows optical microscope image of G2 CT co-crystals made by adding seed crystals from 9 C to a non-agitated mixture of 9-MA and TCNB in 0.025 M SDS solution and incubating at 47° C., scale bar shown is 50 m. Right panel, shows zoomed out view of G2 co-crystal clusters.
Figure 9E:
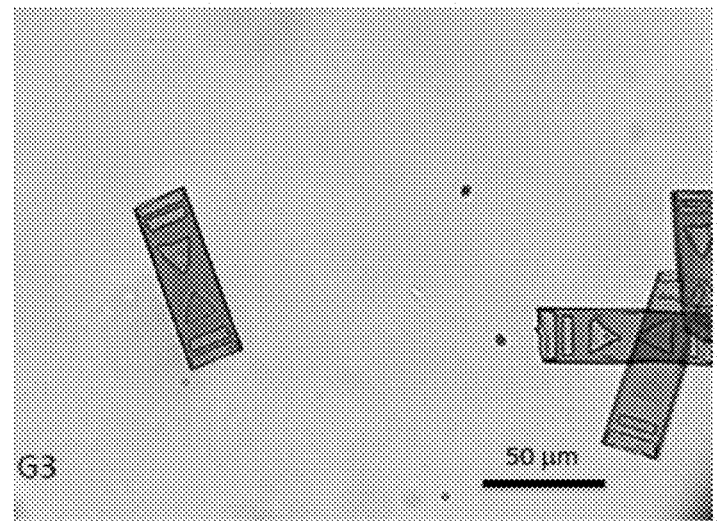
FIG. 9E shows optical microscope image of G3 CT co-crystals made by adding seed crystals from FIG. 9D to a non-agitated mixture of 9-MA and TCNB in 0.025 M SDS solution and incubating at 47° C.

A crop of CT co-crystal was prepared as previously described and filtered from the SDS solution, and the crystals were re-suspended in a fresh 1 mL of 0.025 Molar SDS solution. A saturated solution of the 9-MA and TCNB in SDS at 47° C. was prepared by gently mixing both vials only once with minimum agitation to prevent formation of nucleation cites. A measured amount of CT co-crystal suspension seeds was added to the mixture and gently swirled. The seeded mixture was incubated at 47° C. until larger $2^{nd}$ generation (G2) crystals were fully formed. A similar procedure was followed when preparing G3 crystals using G2 crystals as seeds instead (FIG. 9A). In theory any generation $(G_n)$ can be formed using this method of sequential deposition.

Results and Discussion:

In an attempt to generate uniform shaped co-crystals, fabricated binary charge-transfer molecular crystals via solid-state diffusion of TCNB into 9-MA nanowires imbedded inside AAO templates were reported [Al-Kaysi et al. "J. Formation of Cocrystal Nanorods by Solid-State Reaction of Tetracyanobenzene in 9-Methylanthracene Molecular Crystal Nanorods" Cryst. Growth Des. 2009, 9, 1780-1785, doi:10.1021/cg800898f, incorporated herein by reference in its entirety]. In several days of slow diffusion, red colored CT nanorods of 9-MA/TCNB co-crystals were obtained after dissolving the AAO template with dilute phosphoric acid.

The possibility of generating uniform CT co-crystals via co-precipitation from aqueous surfactants was further explored. When equal volumes of 0.22 M 9-MA and TCNB solutions in DMF were injected rapidly in an aqueous solution containing SDS at a concentration in the range of 0.1 to 0.01 M and stirred, orange red-colored precipitate of the charge-transfer co-crystals instantaneously is formed. The precipitated crystals did not have any specific shape, size or size distribution and were mostly aggregated microparticles. In order to control the shape and size of the charge-transfer co-crystals, precipitation had to occur at a slower rate from a limited number of nucleation sites. Thus, each component of the charge-transfer co-crystal was separately dissolved in an aqueous solution of SDS in water to yield a stable saturated solution. When two mixtures are gently combined without stirring or shaking followed by a period of undisturbed incubation at the appropriate temperature, very long and non-uniform charge-transfer co-crystals separated out over the course of several days FIG. 6A. Varying the concentration of SDS in solution lead to different Cr co-crystal shapes with the most uniform shape occurring at a concentration range 0.05-0.015 molar (FIG. 6C, D). At a lower SDS concentrations (<0.015 molar) immediate co-precipitation of the charge-transfer co-crystals was observed with formation of small crystal fragments and aggregates (FIG. 6 E, F).

Figure 14:
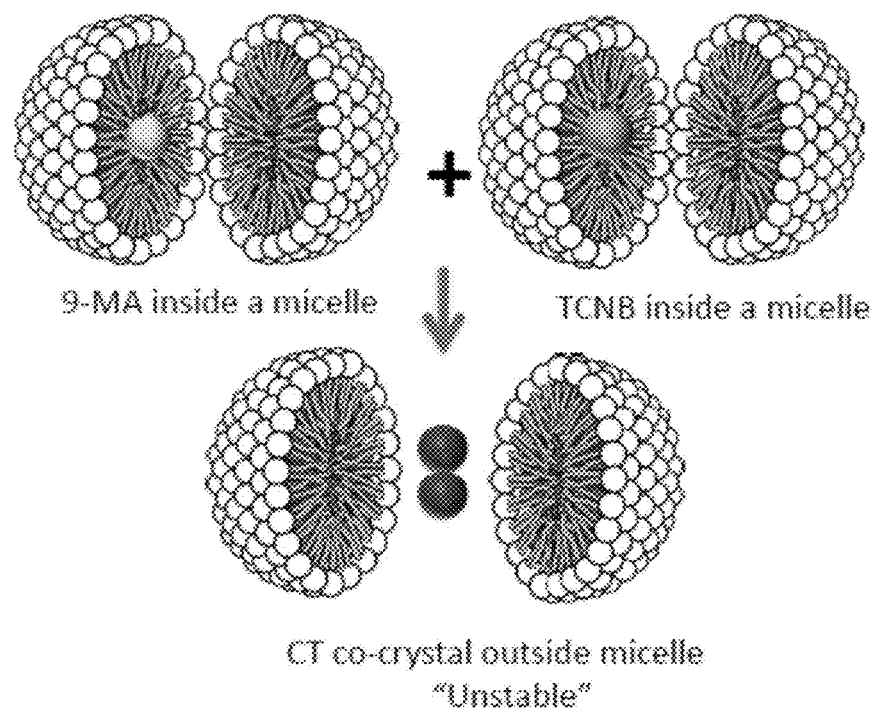
FIG. 14 shows diagram depicting the mechanism of CT co-crystal formation from a micelle.

The concentration of SDS plays a vital role in determining the overall morphology of the precipitated CT crystals. Using SDS concentrations of >0.1 M, forms very long and flat CT co-crystals with random lengths over a long period of incubation time. Some of these crystals measure over 1 cm in length (see FIG. 6A). At SDS concentration of 0.05 M, uniform rectangular plate-like CT crystals precipitate out after several hour of incubation at 47'C (see FIG. 6B). By tuning the concentrations of SDS, 9-MA, and TCNB as well as the incubation temperature, rectangular shaped microcrystals containing totally sealed micro-pockets were obtained, see FIGS. 2, 3 and 4. Adjusting the concentration of SDS such that the number moles of SDS micelles, assuming aggregation number of 60, matches the number of moles of dissolved 9-MA or TCNB gives a stable saturated solution where each organic molecule should, in theory, occupy a single micelle [Malliaris et al. "Temperature dependence of the micelle aggregation number and rate of intramicellar excimer formation in aqueous surfactant solutions" J. Phys. Chem. 1985, 89, 2709-2713, doi:10.1021/j100258a054; Jobe et al. "Sodium Dodecyl sulfate micellar aggregation numbers in the presence of cyclodextrins" Langmuir 1995, 11, 2476-2479; Anachkov et al. "Determination of the aggregation number and charge of ionic surfactant micelles from the stepwise thinning of foam films" Adv. Colloid Interface Sci. 2012, 183-184, 55-67, doi:10.1016/j.cis.2012.08.003; and Pisiraik et al. "Determination of micelle aggregation numbers of alkyltrimethylammonium bromide and sodium dodecyl sulfate surfactants using time-resolved fluorescence quenching" Open Chem. 2015, 13, 922-931, doi:10.1515/chem-2015-0103—each incorporated herein by reference in their entirety]. Gentle mixing of the two saturated solutions causes the loaded and unstable micelles to collide releasing the payload of 9-MA and TCNB to form a stable CT binary complex that is too large and polar to be incorporated inside the hydrophobic core of a micelle. This is the start of a nucleation sites where more 9-MA and TCNB are slowly drawn out of the micelle to be deposit on the growing CT crystal (see FIG. 14).

A method to control the number of nucleation sites is to agitate the mixture by transfer mixing the combined solutions from vial to vial. In general, dimensions of crystals obtained from 4× mixing are twice as large as those from 8× mixing. This may indicate that the number of seeds simply doubled by doubling the number of times the solution was transfer mixed, see FIG. 4A-D. A plot of mixing times "N" vs. crystal dimensions shows that the size of the crystal tapers off after 16× transfers. By increasing the number of mixing times, the number of seed crystals increases and the final crop of CT crystals become smaller and smaller, See FIGS. 4E and F. Using SDS concentration <0.02 molar results in random shaped shard like CT crystals with no unique morphology FIGS. 6E and 6F.

Effect of Incubation Temperature:

The effect of temperature on the size and shape of the CT crystals was systematically varied from 27° C. to 57° C. with 10-degree increments. Using 0.025 M SDS, the effective incubation temperature that gave uniform CT crystals was observed in the range of 37-47° C. Mixing the components at 27° C., the uniformity of the CT crystals decreased with the formation of random shape crystals. Mixing at 57° C., micelles tend to loose structure and uncontrolled fast precipitation of the CT crystals leads to non-uniform crystal clusters. Thus, mixing and incubation at temperatures between 37° C. (FIG. 3A-3E) and 47° C. (FIG. 4A-4D) was ideal, with the latter giving thinner microcapsules and better size distribution.

Figure 6A:
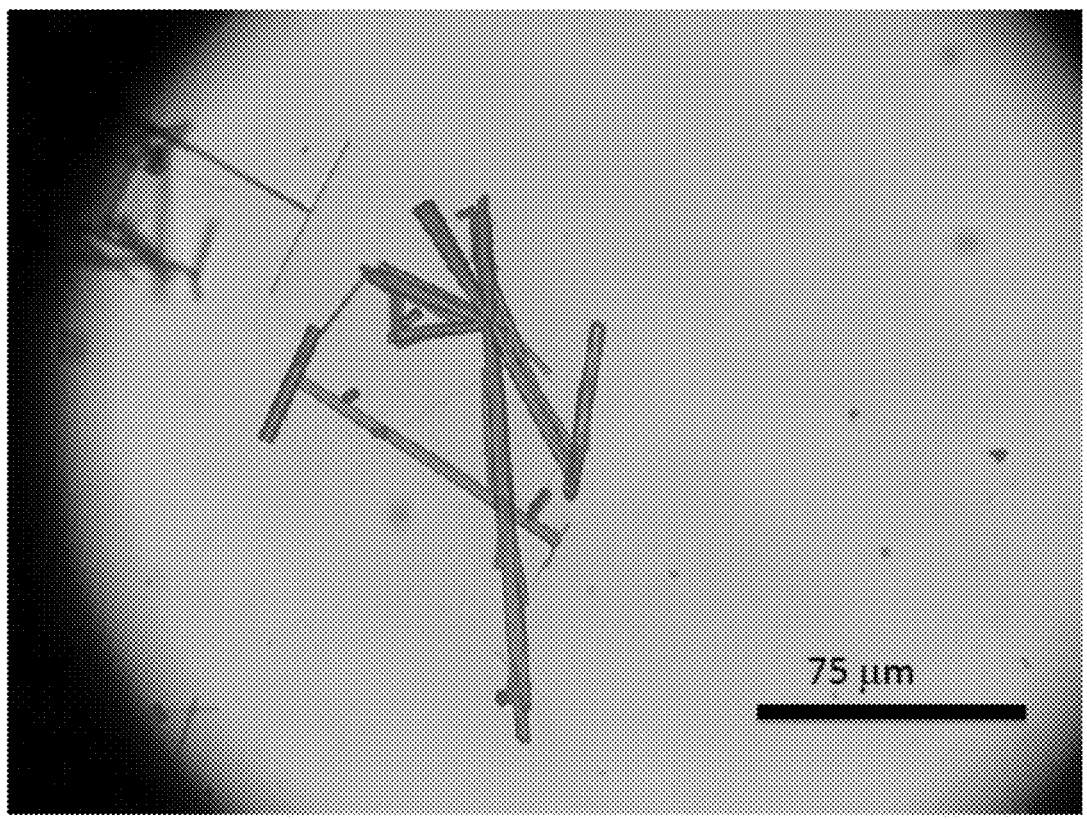
FIG. 6A shows optical microscope image of charge-transfer co-crystal of 9-MA and TCNB obtained from a solution comprising 0.1 M SDS and incubated at 47° C. with slow diffusion without agitation.
Figure 6B:
FIG. 6B shows optical microscope image of charge-transfer co-crystal of 9-MA and TCNB obtained from a solution comprising 0.05 M SDS and incubated at 47° C. with slow diffusion without agitation, scale bar shown is 75 μm.
Figure 6C:
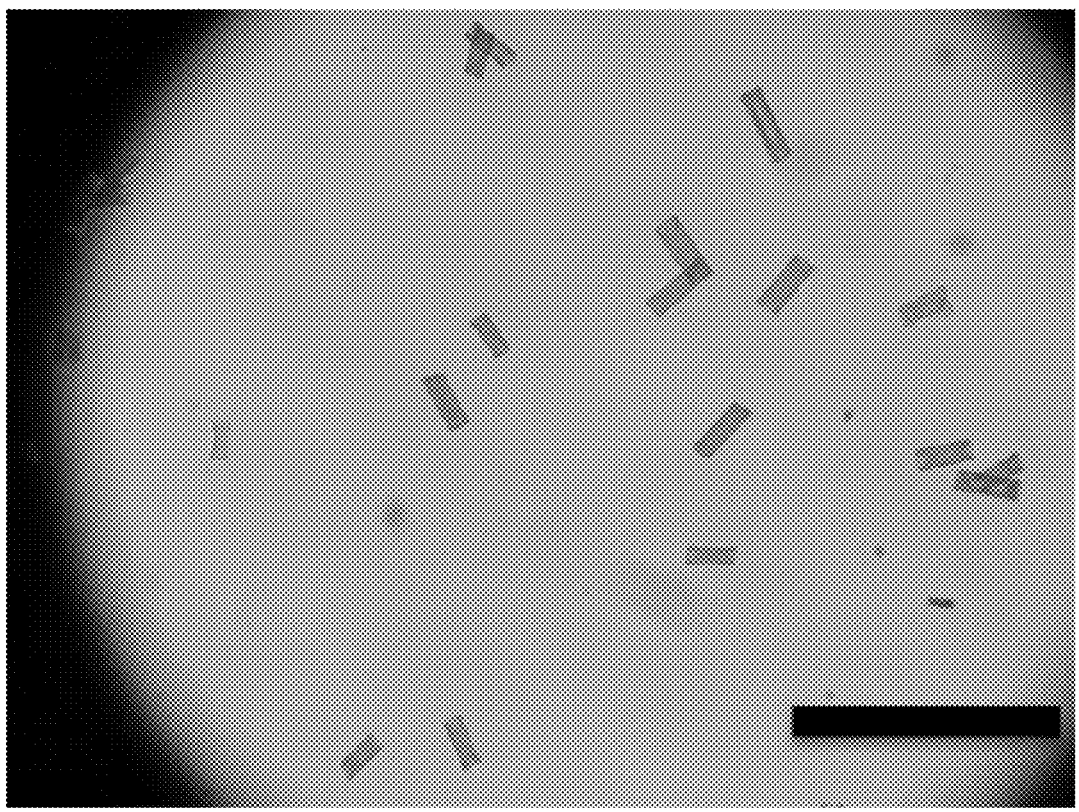
FIG. 6C shows optical microscope image of charge-transfer co-crystal of 9-MA and TCNB obtained from a solution comprising 0.025 M SDS and incubated at 47° C. with slow diffusion without agitation, the scale bar shown is 75 μm.
Figure 6D:
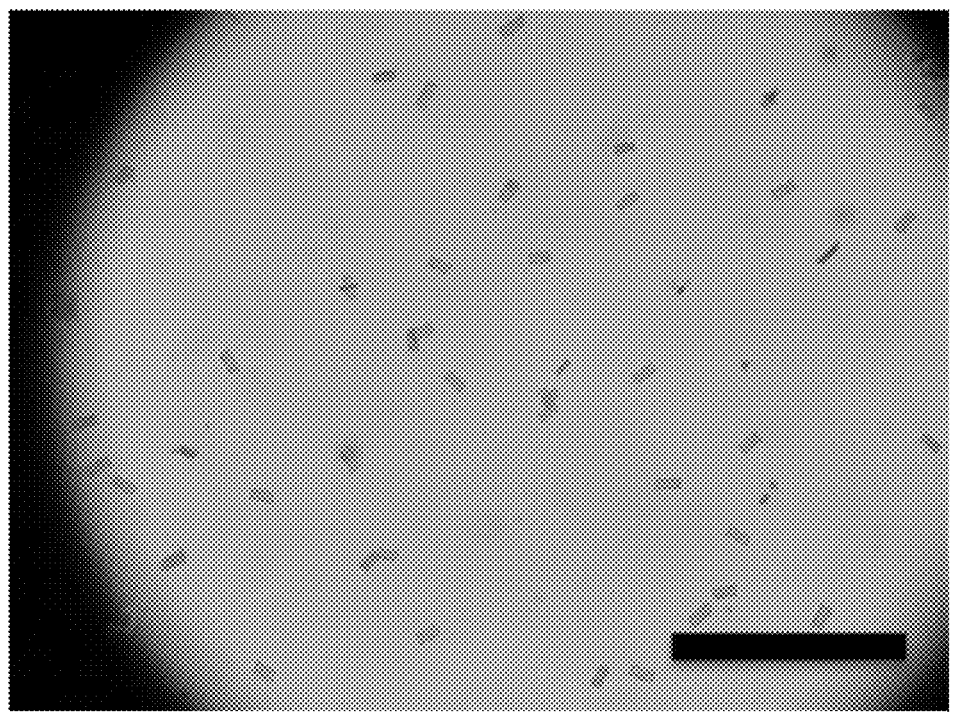
FIG. 6D shows optical microscope image of charge-transfer co-crystal of 9-MA and TCNB obtained from a solution comprising 0.02 M SDS and incubated at 47° C. with slow diffusion without agitation, scale shown is 75 μm.
Figure 6E:
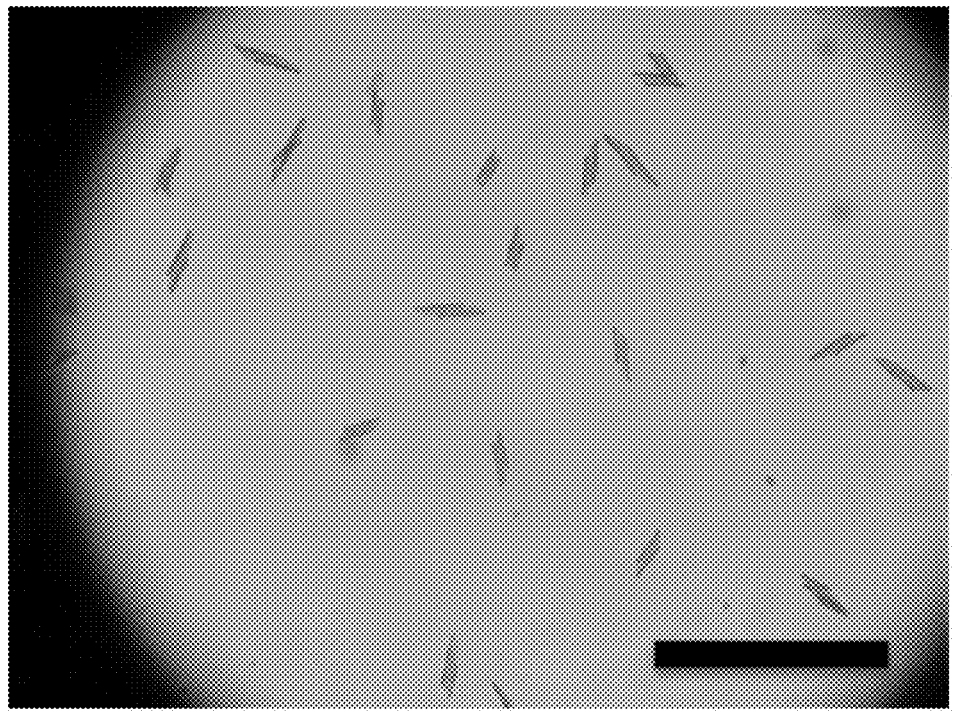
FIG. 6E shows optical microscope image of charge-transfer co-crystal of 9-MA and TCNB obtained from a solution comprising 0.015 M SDS and incubated at 47° C. with slow diffusion without agitation, scale bar shown is 75 μm.
Figure 6F:
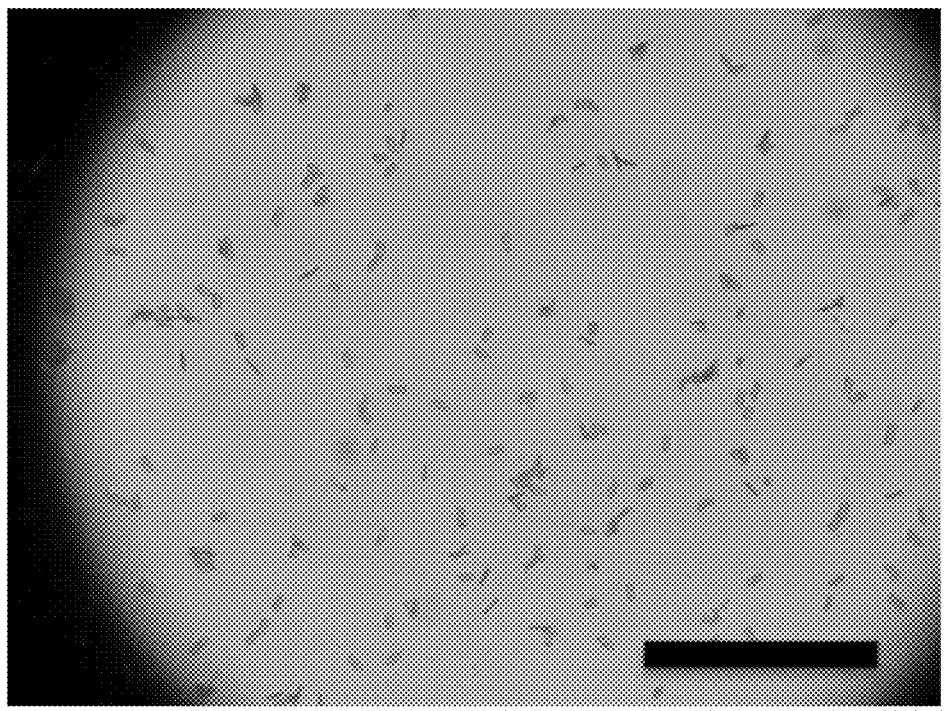
FIG. 6F shows optical microscope image of charge-transfer co-crystal of 9-MA and TCNB obtained from a solution comprising 0.01 M SDS and incubated at 47° C. with slow diffusion without agitation, scale bar shown is 75 μm.
Figure 15:
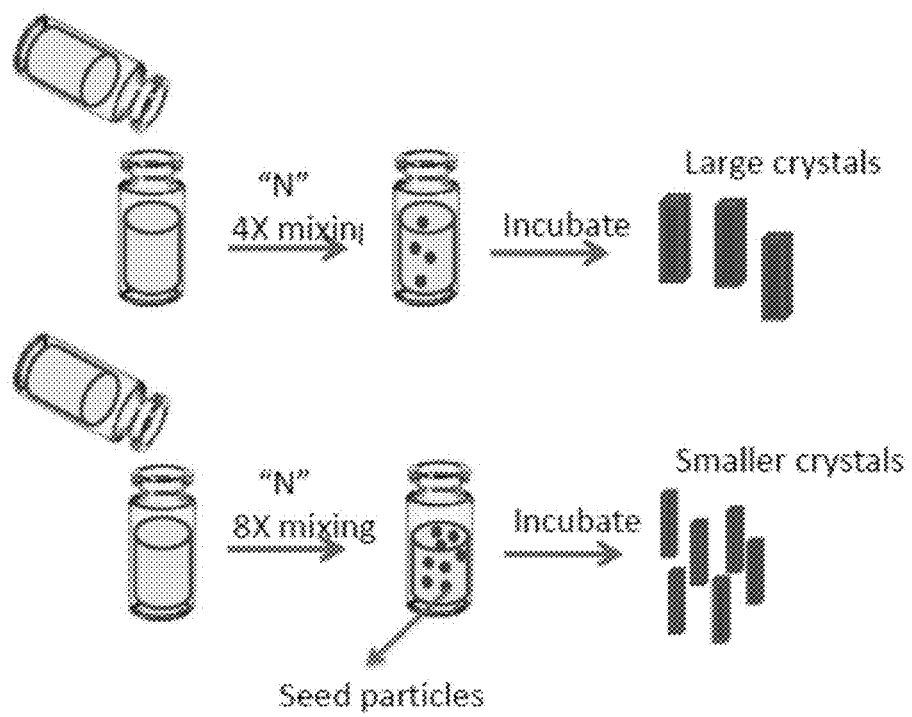
FIG. 15 shows a diagram how increasing "N", the number of mixing times, increases the number of seed particle and decreases the overall final size of charge-transfer co-crystal

Effect of Mixing Mode and Initial Seed Formation:

By carefully adding solution containing acceptor molecules to a solution containing donor molecules (or vice versa) and allowing the two solutions to diffuse slowly over a period of several days, yields ultra-long solid core CT crystals (FIG. 6A). Tumble rotation at 47° C., in general, yields very thin, uniform and flat CT crystals (FIG. 5A) and does not yield hollow pocket CT co-crystal morphology. The most effective method of agitation in which the size of the CT co-crystal can be controlled at a fixed SDS concentration is to transfer the mixture between two vials for a number of time (N), then incubate the mixture undisturbed for the crystals to fully grow. As the number "N" increases the initial number of seed particles increases (FIG. 15), thus giving smaller crystals after incubation. This mode of agitation was effective in giving satisfactory control over the desired CT co-crystal dimensions. In order to obtain the smallest possible CT crystals the mixture of A and D was given a couple of quick bursts from a probe sonicator and allowed to incubate at 47° C.

Sonication induces the formation of a maximum number of seed crystals that grow into smaller rectangular shape sheets of Cr co-crystals (FIGS. 5A and B).

Growth Mechanism

Figure 16:
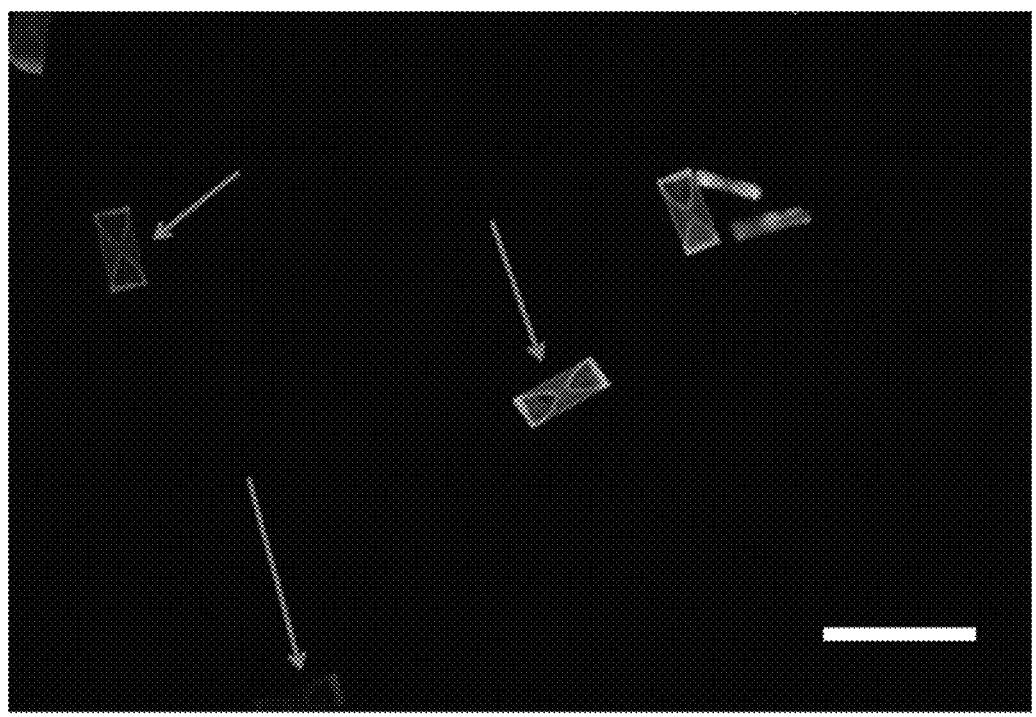
FIG. 16 shows cross-polarized optical microscopy image of charge-transfer co-crystals of 9-MA and TCNB, scale bare is 50 micrones. Arrows indicate birefringence of the co-crystal at different orientations.

The crystal morphology obtained from 0.025 M SDS was further investigated. As can be seen in FIGS. 3A-F and 4A-D, the rectangular shaped crystals have apparent triangular holes, when observed using an optical microscope. Looking at these crystals using cross polarized microscopy shows that the entire structure is a single crystal as revealed by the disappearance of its birefringence upon rotation in the plane of cross polarized light (FIG. 16).

Figure 17:
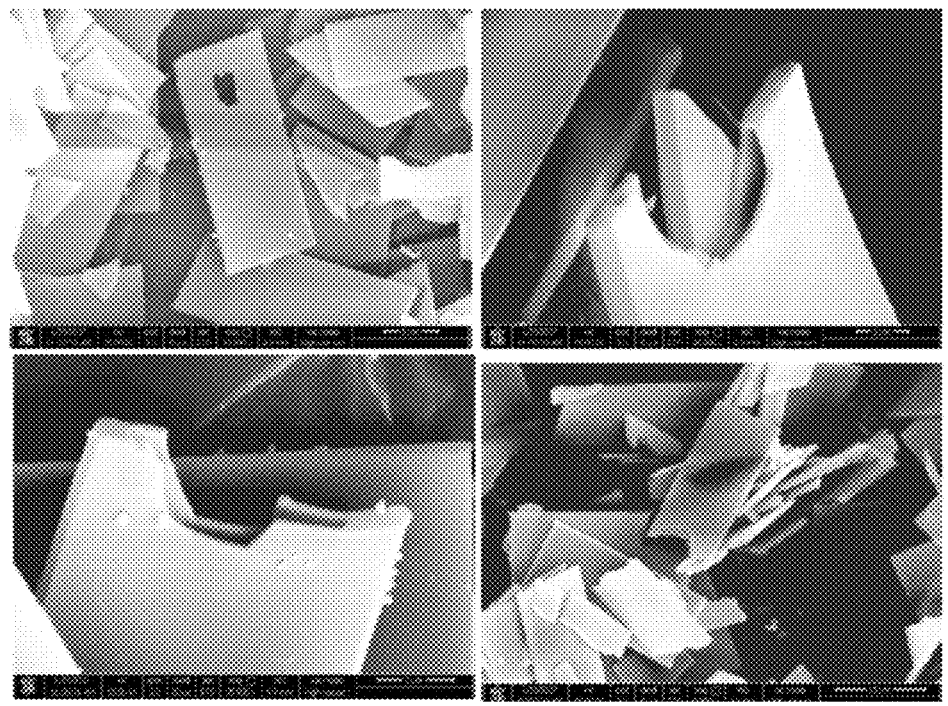
FIG. 17 shows SEM image of broken charge-transfer co-crystals of 9-MA and TCNB by ultrasonication of crystals.

When observed using a scanning electron microscope the unambiguous structure of the crystal was revealed to contain sealed triangular "holes" forming enclosed pockets (FIGS. 8A-D, 9A-B). By varying the agitation number "N", the size of the crystal and volume of enclosed pocket can be decreased as seen in FIGS. 4A-D. In a separate experiment, the microcapsules were broken open by using a sonicator probe, in order to look closer into their interior morphology (FIG. 17).

Figure 7:
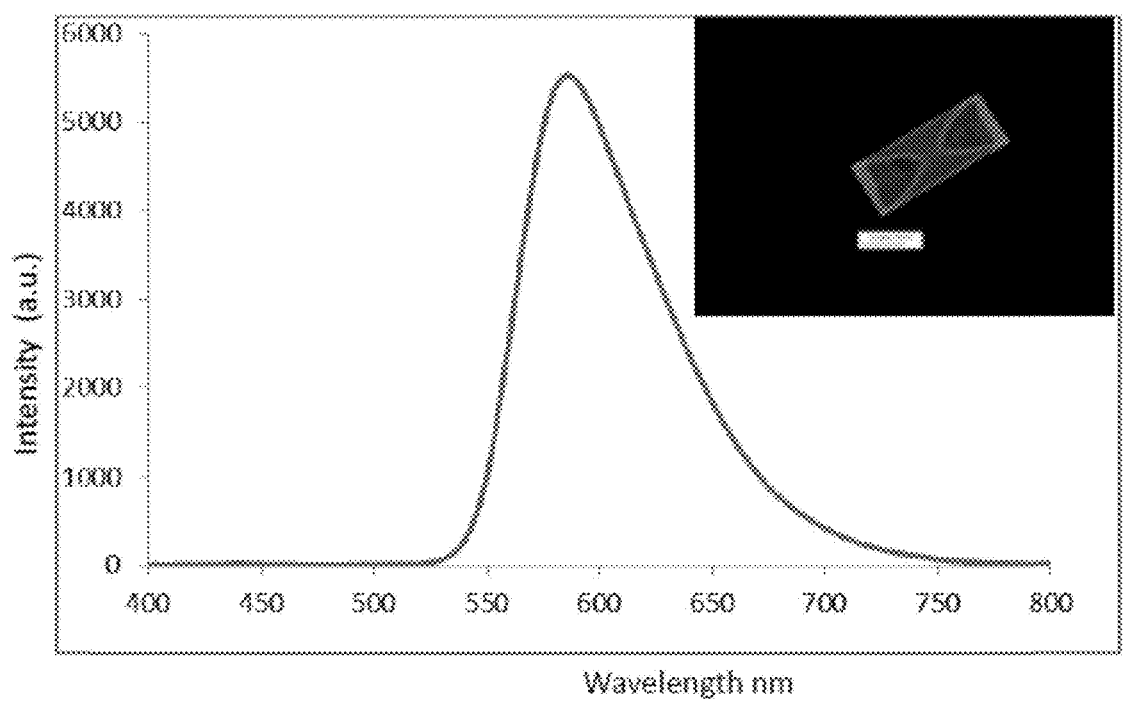
FIG. 7 shows the emission spectrum from a single charge-transfer co-crystal of 9-MA and TCNB using excitation wavelength of 365 nm. Inset is a fluorescence microscope image of the charge-transfer co-crystal excited at 365 nm with red emission.
Figure 8A:
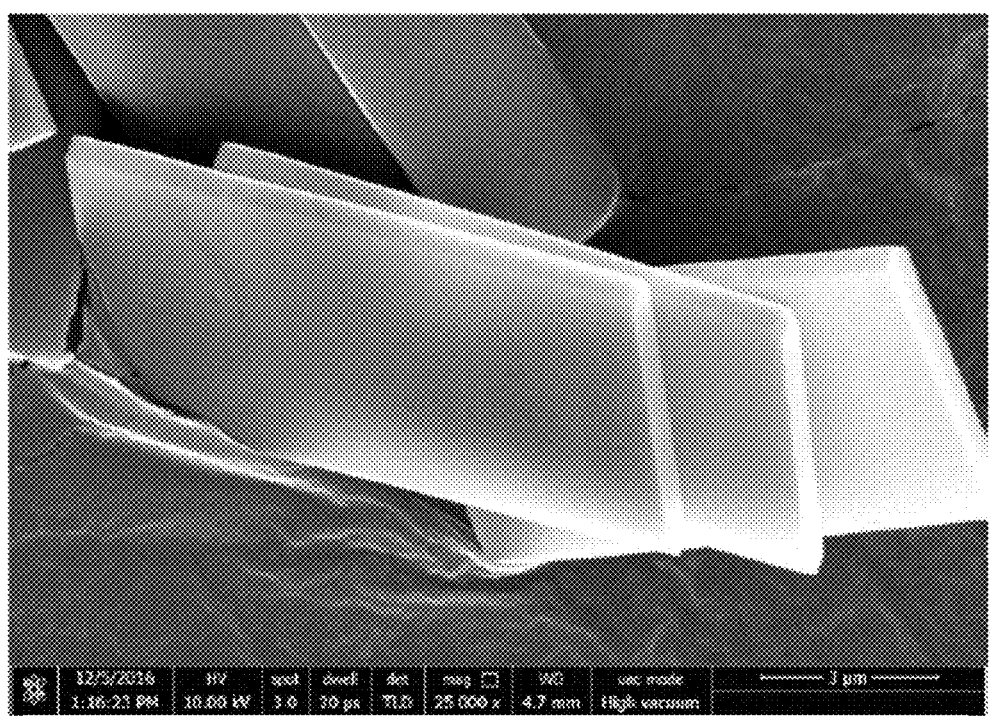
FIG. 8A shows one view of a SEM image of the 8 times agitated charge-transfer co-crystals of 9-MA and TCNB at magnification 25K.
Figure 8B:
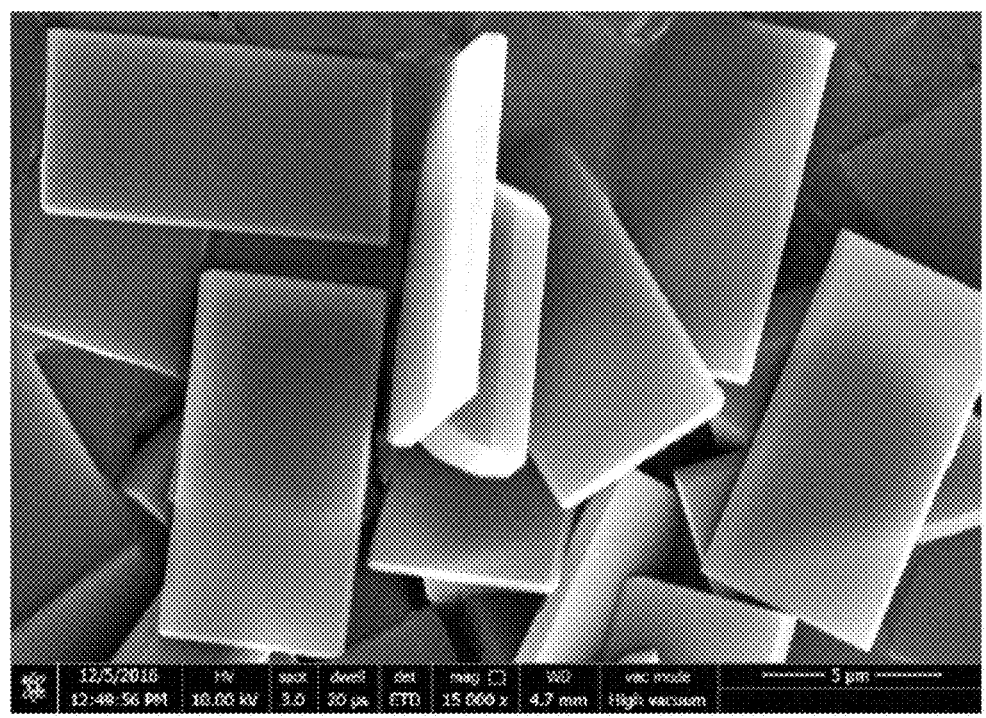
FIG. 8B shows a second view of a SEM image of the 8 times agitated charge-transfer co-crystals of 9-MA and TCNB at magnification 15K.
Figure 8C:
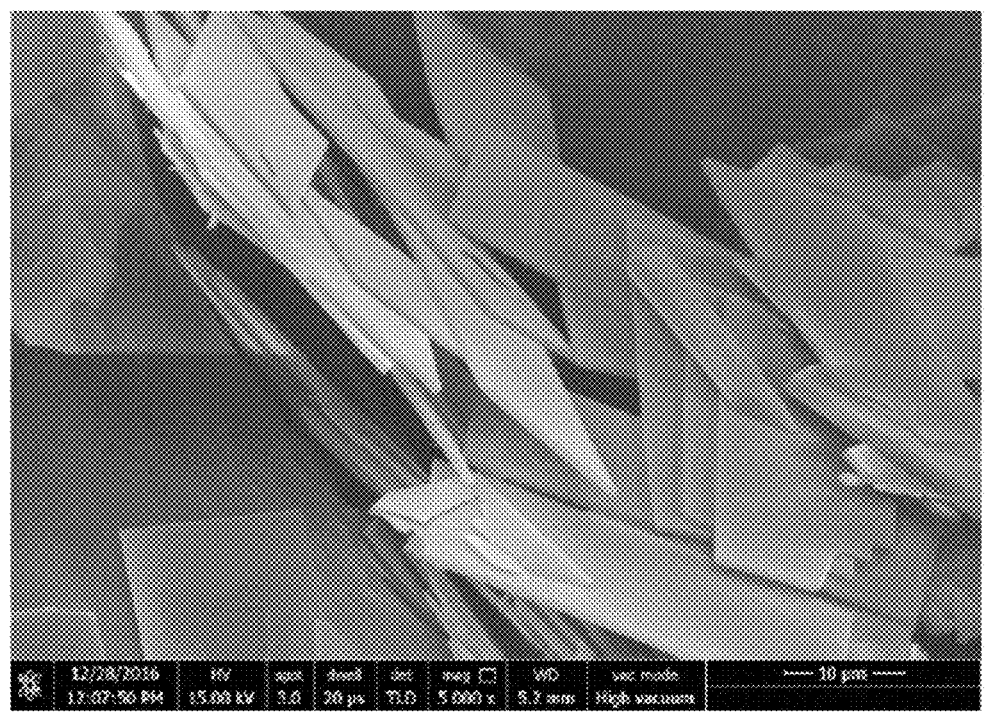
FIG. 8C shows a third view of a SEM image of the 8 times agitated charge-transfer co-crystals of 9-MA and TCNB at magnification 5K.
Figure 8D:
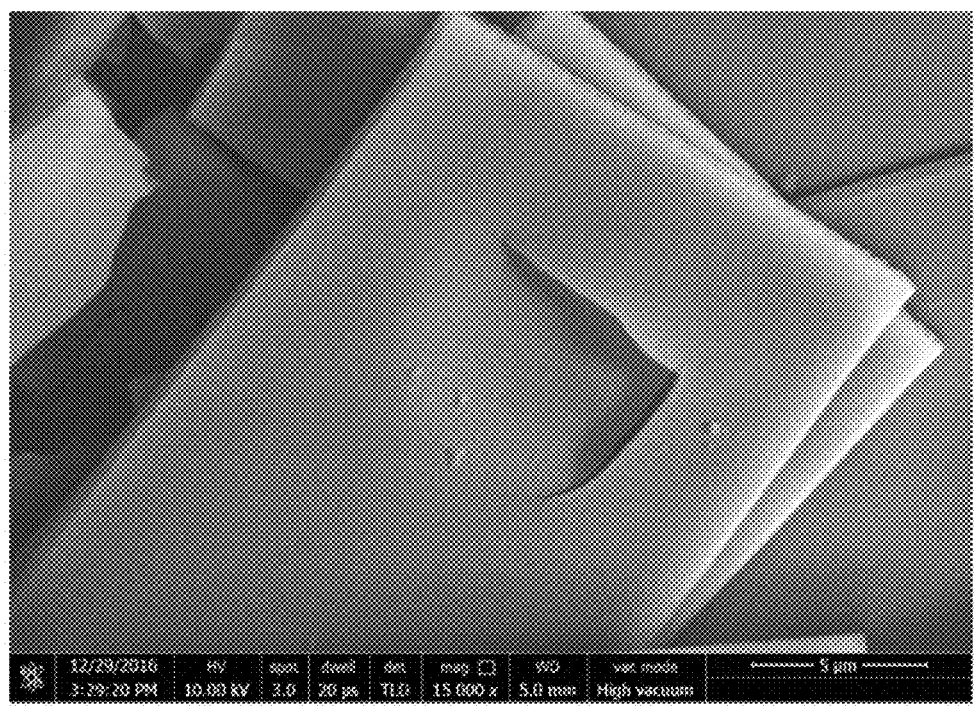
FIG. 8D shows a SEM image of the 8 times agitated charge-transfer co-crystals of 9-MA and TCNB and one of the capsules was punched inwards causing it to crack at magnification 15K.

The thin walls of the capsule were the first to burst and crack from the cavitation shock wave. Upon closer inspection of the CT microcapsules grown from SDS, it looks like the crystals are made from a squashed hexagon due to strong binding of the SDS to the (001) face of the crystal and hindering its growth. The photophysical properties of the CT microcrystal pockets are no different than those of the larger CT co-crystals formed from co-crystallization of 9-MA and TCNB from a good solvent. The fluorescence from a single microcrystal pocket was obtained using excitation wavelength of 365 nm, FIG. 7.

Figure 13:
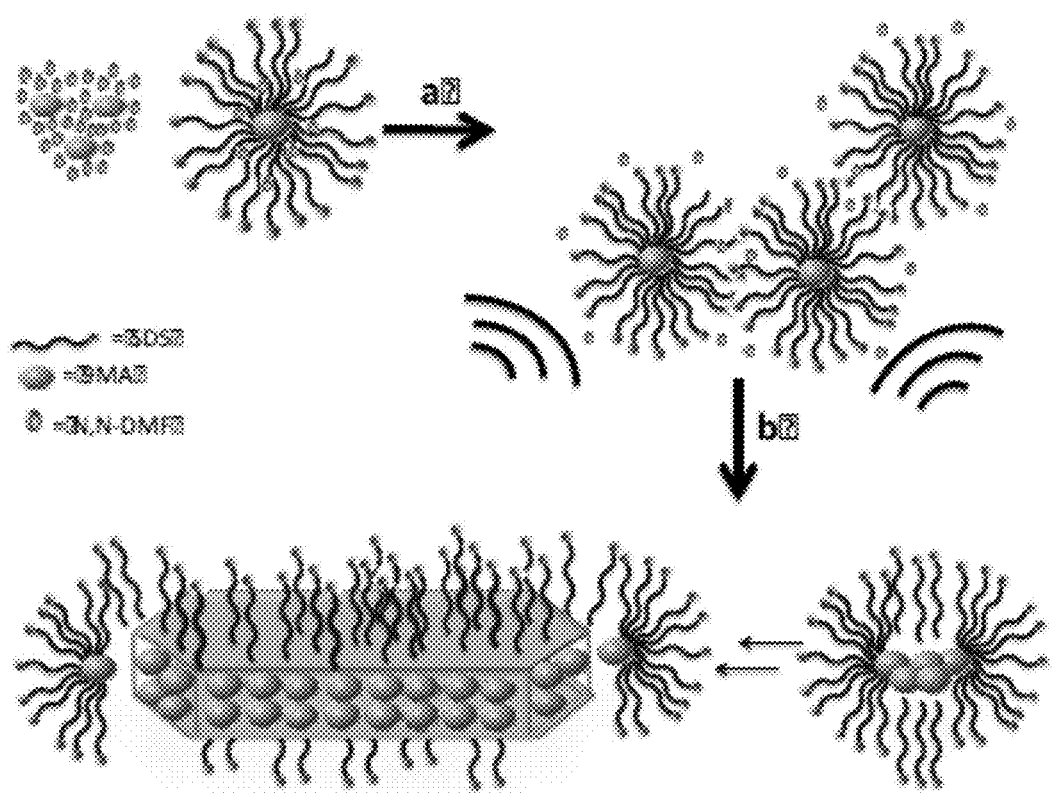
FIG. 13 shows the proposed mechanism of formation of the charge transfer crystal of 9-methylanthracene and TCNB form a solution comprising dodecyl sulfate.

Formation of hollow or tube-like cavities can be attributed to faster growth rate on the surface of the crystal from that in the interior of the crystal. In the case of tube-like crystals the rate of growth and dissolution is constant throughout the crystallization process which leads to a uniform hollow crystal. In the case of the microcapsules, the surfactant plays a role in varying the rate of growth and dissolution. FIG. 13 shows the steps involved in hollow crystal formation of 9-MA and TCNB in aqueous solution comprising SDS. Initially, crystal growth is fast where all the loaded micelles are depositing their payload on the fastest growing surface of a seed crystal. When most of the donor and acceptor molecules have been deposited, rate of dissolution becomes faster while deposition rate slows down. At a certain point, the presence of unloaded SDS slows down the dissolution rate while crystal growth seals up the cavity. When the number of nucleation sites or seeds increases the volume ratio of cavity to crystal decreases till it becomes zero. Such an observation was also made at SDS concentration of 0.05 M. This may suggest that the deposition rate increases with respect to the slower dissolution rate as the concentration of SDS increases.

More complex CT microcrystals were obtained by using first generation (G) microcapsules as scaffolds to grow second (G2) and third (G3) generation crystals with separated pocket compartments (FIGS. 9A and B, C, D, E).

Figure 12:
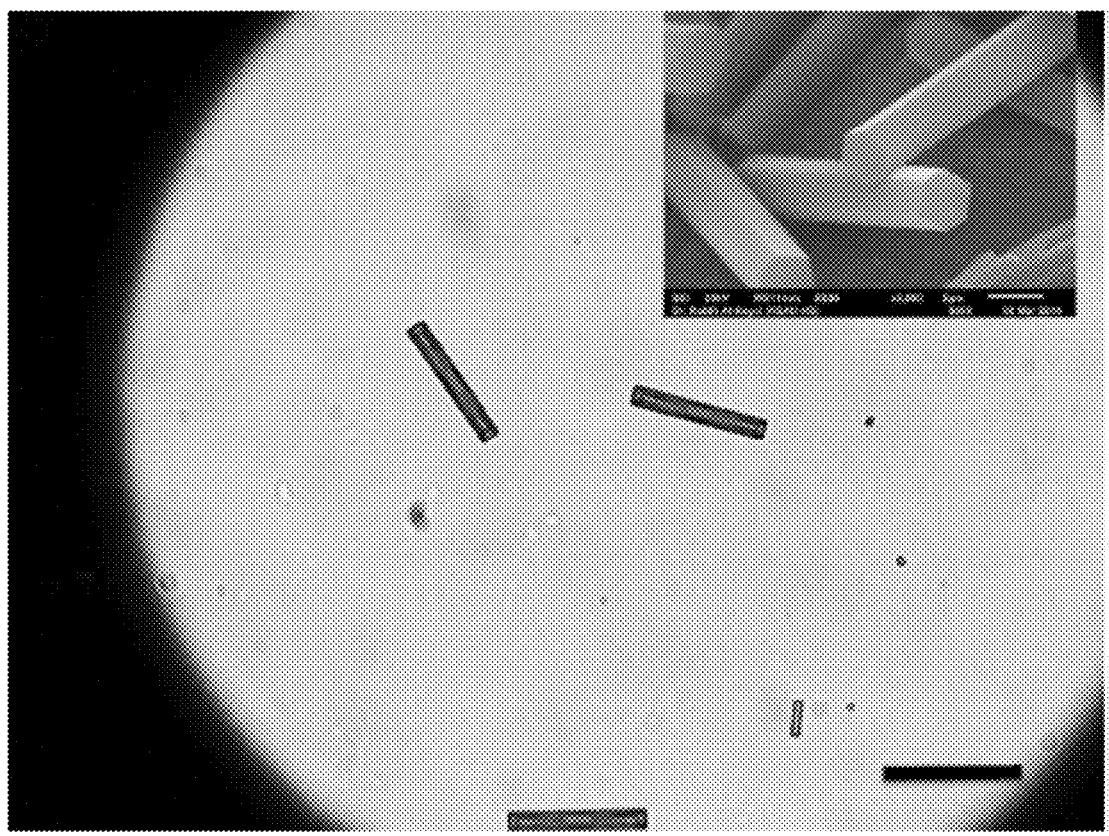
FIG. 12 shows an optical microscope image sealed CT co-crystal of 9-MA and TCNB precipitated from solution of Pluronic F-127, a non-ionic surfactant, using 4 times mixing (FIG. 1B), scale bar is 30 μm. Inset shows the SEM image of the crystals at magnification 3.5K.

Changing the surfactant to a non-ionic type such as Pluronic-F127 with an optimum concentration of 0.1% in water did lead to a different charge-transfer co-crystal morphology with elongated hexagonal crystal habit. The hexagonal crystal dimensions varied in a similar fashion upon mixing. Also, the crystals had a sealed hollow morphology as it has been seen by the optical microscope image and SEM FIG. 12. Unlike the crystals produced from SDS, the pocket sizes are relatively small.

Figure 10:
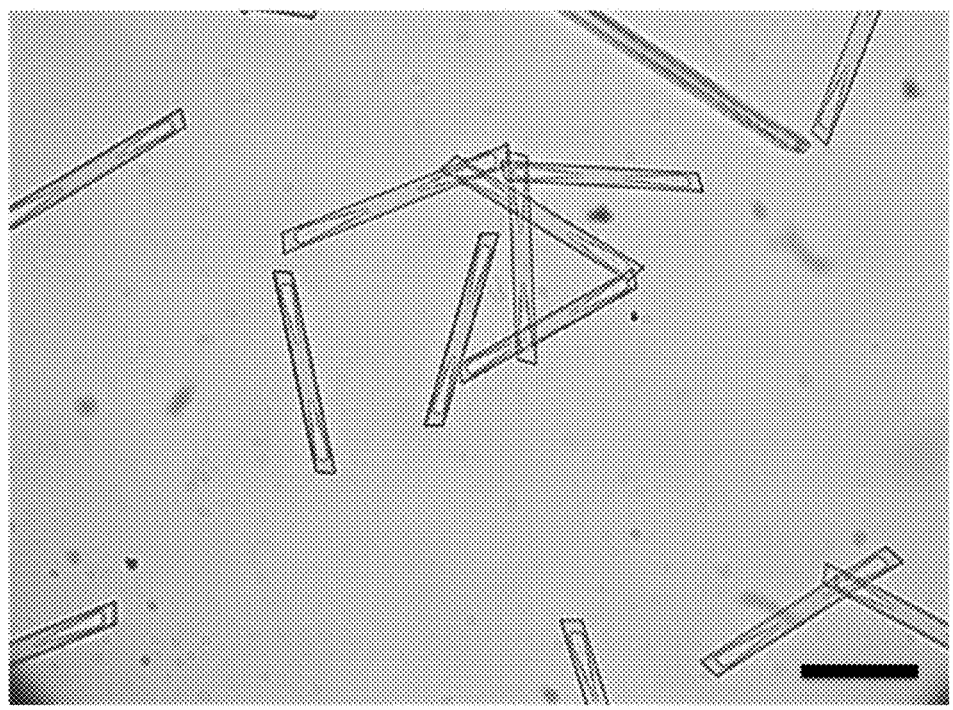
FIG. 10 shows optical microscope image of microcapsules charge-transfer co-crystal of naphthalene and TCNB formed from a 0.025 molar solution of SDS followed by incubation at 47° C., using the method described in FIG. 1B, scale bar shown is 30 μm.

In an effort to verify the generality of this method of generating uniform shape Cr co-crystals, several other donor molecules such as pyrene and naphthalene were utilized. Blue fluorescent Cr co-crystals were obtained from naphthalene/TCNB having the hollow morphology and could be grown into second-generation crystals as well, see FIG. 10A and FIG. 10B.

Figure 11A:
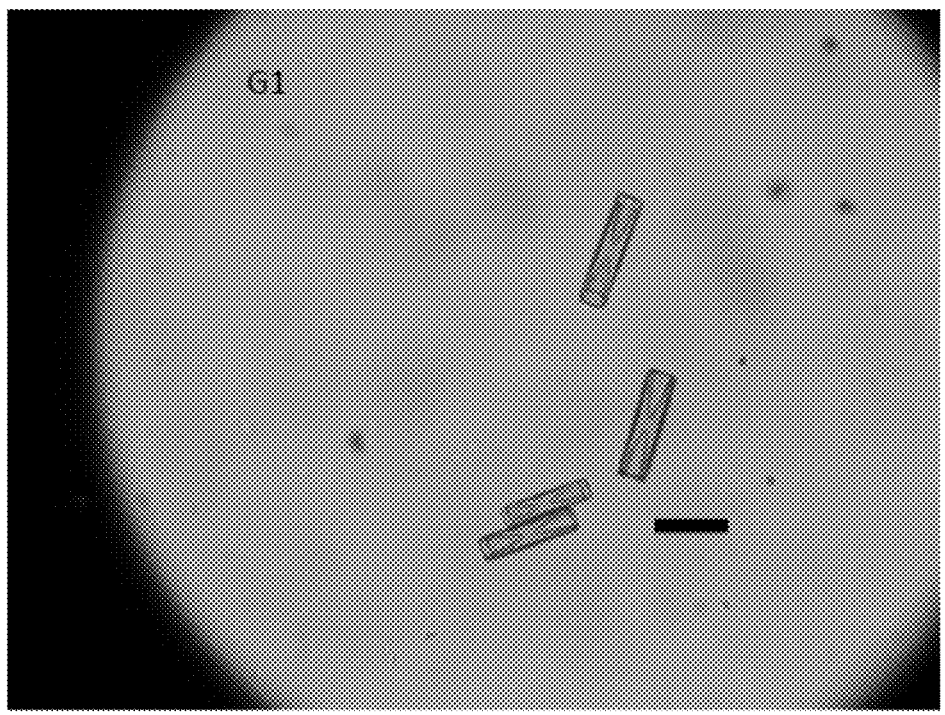
FIG. 11A shows optical microscope image of microcapsules charge-transfer co-crystal of f-butyl ester of 9-carboxyanthracene and TCNB formed from a 0.025 molar solution of SDS. Mixed 4 times and incubated at 47° C., the frame width is 30 μm.
Figure 11B:
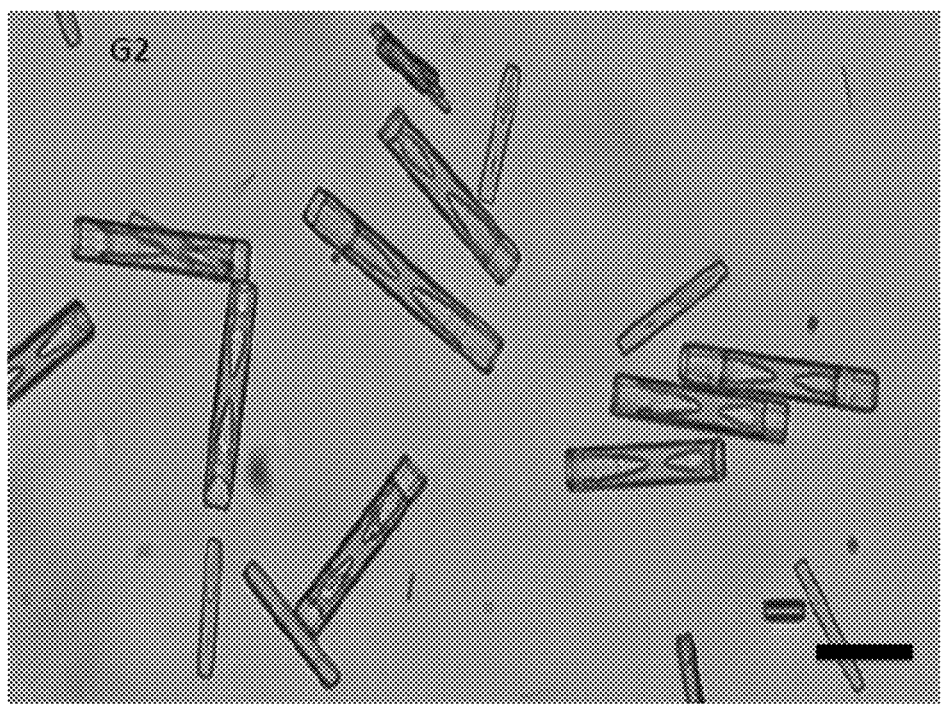
FIG. 11B shows optical microscope image of a second generation CT co-crystal of t-butyl ester of 9-carboxyanthracene and TCNB formed from a solution of SDS, frame width is 30 μm.
Figure 18:
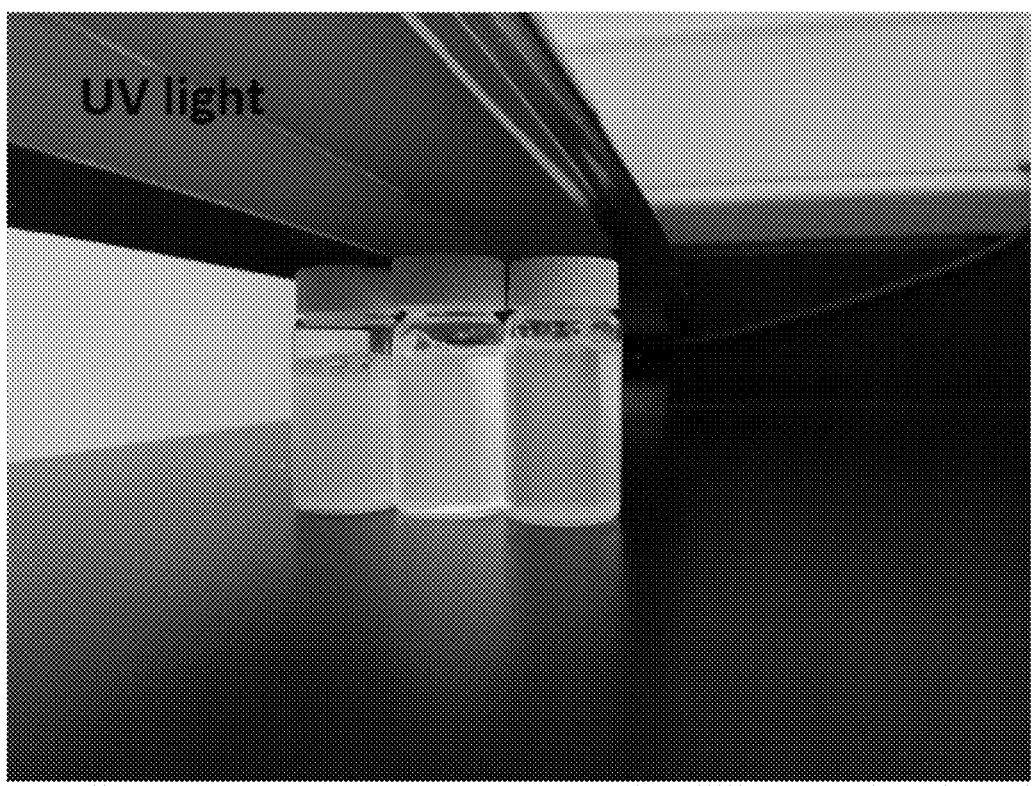
FIG. 18 shows fluorescence of different charge-transfer co-crystals in aqueous suspension, excitation wavelength 365 nm. From left to right: Pyrene/TCNB microrods (gray-white), Naphthalene/TCNB (cyan blue), 9-Methylanthracene/TCNB microcapsules (pink red).

In FIGS. 11 A and B the CT co-crystal between 9TBAE/TCNB while FIG. 18 shows the different fluorescent color of the CT CO-crystals when excited with 365 nm light.

The invention claimed is:

1. A charge transfer hollow crystal, comprising: a π-electron donor and π-electron acceptor having two or more sealed compartments with the proviso that the π-electron donor and π-electron acceptor are not 9-methylanthracene (9-MA) and 1,2,4,5-tetracyanobenzene, respectively (TCNB).

2. The hollow co-crystal of claim 1, wherein the crystal is rectangular with at least two symmetrical sealed compartments.

3. The crystal of claim 1, wherein the electron π-donor is an optionally substituted naphthalene, anthracene, phenanthrene, pyrene, or chrysene.

4. The crystal of claim 3, wherein the electron π-donor is selected from the group consisting of anthracene, 9-methylanthracene (9-MA), 9-methoxyanthracene (MXA), tert-butyl anthracene-9-carboxylate (9TBAE), or 9,10-dimethylanthracene.

5. The crystal of claim 1, wherein the π-electron acceptor is 2,3,5,6-tetrafluoroterephthalonitrile (TFPN).

6. The crystal of claim 1, wherein the hollow crystal is a hexagonal rod-shaped crystal.

7. The crystal of claim 1, having paired sets of twin symmetrical sealed compartments each set comprising at least two sealed compartments.

8. The crystal of claim 7, wherein each set of twin symmetrical sealed compartments includes two shapes of sealed compartments.

9. The crystal of claim 7, wherein each set of twin symmetrical sealed compartments includes a triangular sealed compartment and at least one trapezoidal sealed compartment.

10. The crystal of claim 8, wherein each set of twin symmetrical sealed compartments includes three compartments comprising a triangular sealed compartment and two trapezoidal sealed compartments.

11. The crystal of claim 1, wherein the hollow crystal is a single crystal with a long axis terminating in flat ends perpendicular to the long axis, wherein the crystal has two sealed compartments twinned around a perpendicular axis that is perpendicular to and bisects the long axis of the crystal at a center point of the crystal, and wherein each sealed compartment has a triangular shape with the apex oriented towards the perpendicular axis and a base proximal to a flat end of the crystal.

12. The crystal of claim 1, comprising 1,2,4,5-tetracyanobenzene (TCNB).

13. The crystal of claim 1, further comprising one or more molecules inside the sealed compartments.

* * * * *